United States Patent [19]

Hitchcock, Sr. et al.

[11] Patent Number: 4,656,580
[45] Date of Patent: Apr. 7, 1987

[54] LOGIC SIMULATION MACHINE

[75] Inventors: Robert B. Hitchcock, Sr., Binghamton; Matthew C. Graf, Highland, both of N.Y.

[73] Assignee: International Business Machines Corporation, Armonk, N.Y.

[21] Appl. No.: 387,408

[22] Filed: Jun. 11, 1982

[51] Int. Cl.[4] .............................................. G06F 7/38
[52] U.S. Cl. .................................................... 364/200
[58] Field of Search ... 364/200 MS File, 900 MS File

[56] References Cited

U.S. PATENT DOCUMENTS

| | | | |
|---|---|---|---|
| 3,278,732 | 10/1966 | Haynes | 235/164 |
| 3,308,285 | 3/1967 | Winder | 235/175 |
| 3,381,117 | 4/1968 | Forslund et al. | 235/164 |
| 3,400,379 | 9/1968 | Harman | 340/172.5 |
| 3,458,240 | 7/1969 | Hanson | 328/92 |
| 3,544,973 | 11/1970 | Borck, Jr. et al. | 340/172.5 |
| 3,614,745 | 10/1971 | Podvin | 340/172.5 |
| 3,728,534 | 4/1973 | Bertram et al. | 235/184 |
| 3,810,114 | 5/1974 | Yamada et al. | 340/172.5 |
| 3,902,050 | 8/1975 | Schmidt et al. | 235/152 |
| 3,913,070 | 10/1975 | Malcolm et al. | 340/172.5 |
| 4,015,246 | 3/1977 | Hopkins, Jr. et al. | 340/172.5 |
| 4,035,777 | 7/1977 | Moreton | 364/200 |
| 4,050,058 | 9/1977 | Garlic | 364/200 |
| 4,053,947 | 10/1977 | Carlsson et al. | 364/200 |
| 4,057,845 | 11/1977 | Ejuri et al. | 364/200 |
| 4,065,808 | 12/1977 | Schomberg et al. | 364/200 |
| 4,067,058 | 3/1978 | Brandstaetter et al. | 364/200 |
| 4,079,455 | 4/1978 | Ozga | 364/200 |
| 4,084,224 | 4/1978 | Appell et al. | 364/200 |
| 4,087,794 | 5/1978 | Beausoleil et al. | 364/200 |
| 4,306,286 | 12/1981 | Cocke et al. | 364/200 |

OTHER PUBLICATIONS

Agrawal et al, "Mixed-Mode Simulation in the MOTIS System", Journal of Digital Systems, vol. V, No. 4, 1981, pp. 383–399.
IBM Technical Disclosure Bulletin, vol. 25, No. 1, Jun. 1982.

Primary Examiner—Thomas M. Heckler
Attorney, Agent, or Firm—Sughrue, Mion, Zinn, Macpeak and Seas

[57] ABSTRACT

An improved logic simulation machine in which non-unitary delays of logic functions being simulated are permitted and in which the delay time can be made different for low-to-high and high-to-low transitions. A plurality of basic processors are interconnected with a control processor through an inter-processor switch. The logic functions being simulated are divided among the various basic processors. The control processor provides primary input data and communicates the results computed by the basic processors with other ones of the basic processors as needed. All of the basic processors and the control processor operate in variable length work cycles. The length of a work cycle is determined by a minimum work space value among all of the logic functions to be simulated, that is, a minimum time to a next successive transition in a simulated output among all of the simulated logic functions. Further, the presence of glitches in the simulated output is detected. The detected glitches are suppressed if their duration is less than the delay time of the logic function being simulated for a particular transition it is predicted to undergo.

21 Claims, 43 Drawing Figures

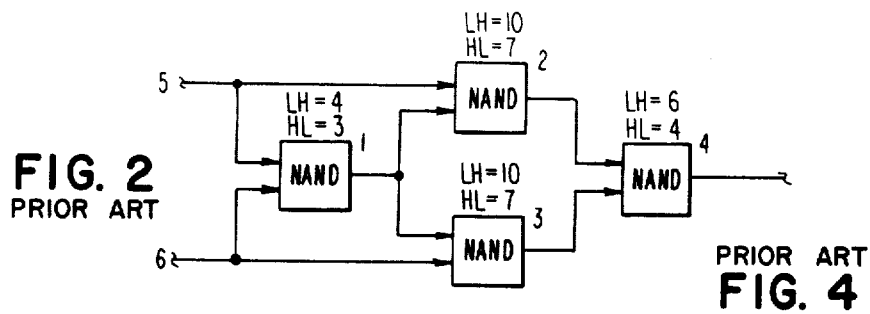
FIG. 2 PRIOR ART
FIG. 4 PRIOR ART
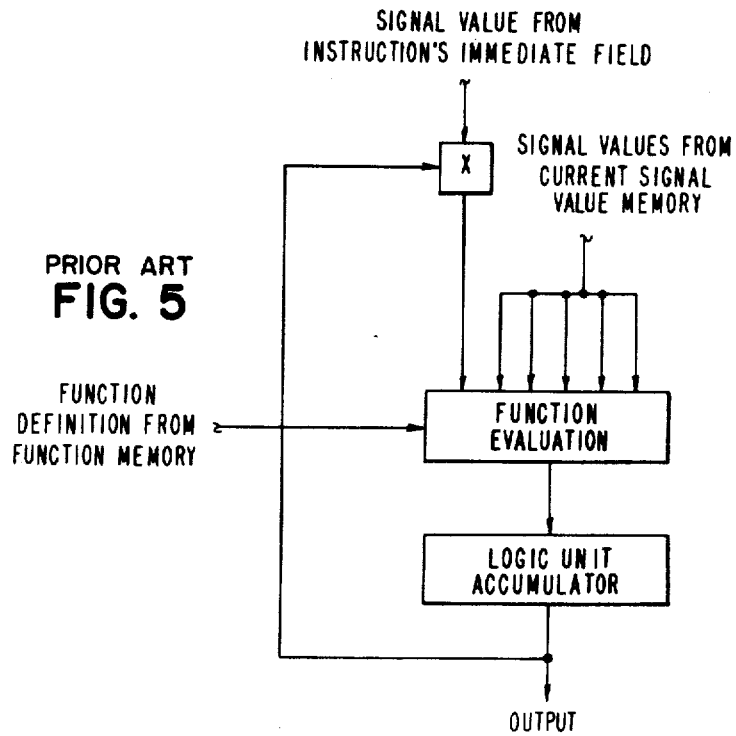
FIG. 3 PRIOR ART
FIG. 5 PRIOR ART

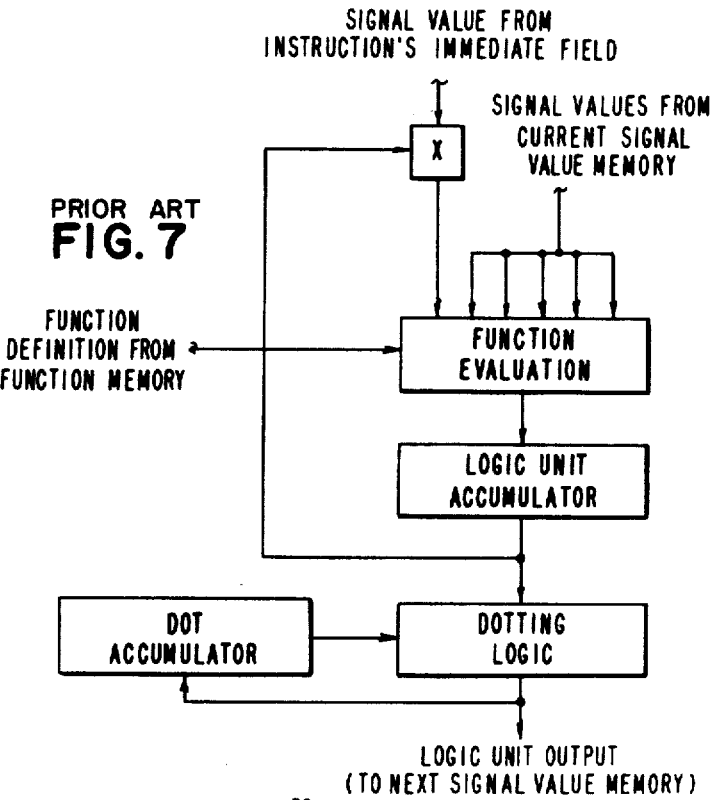
PRIOR ART
FIG. 6
PRIOR ART
FIG. 7
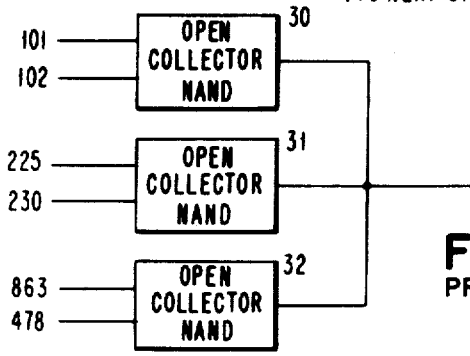
FIG. 8
PRIOR ART

PRIOR ART FIG. 9

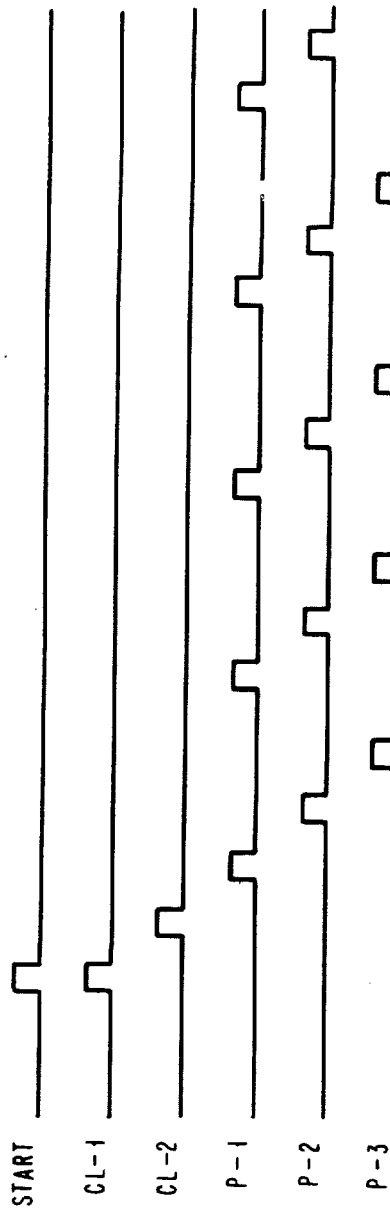

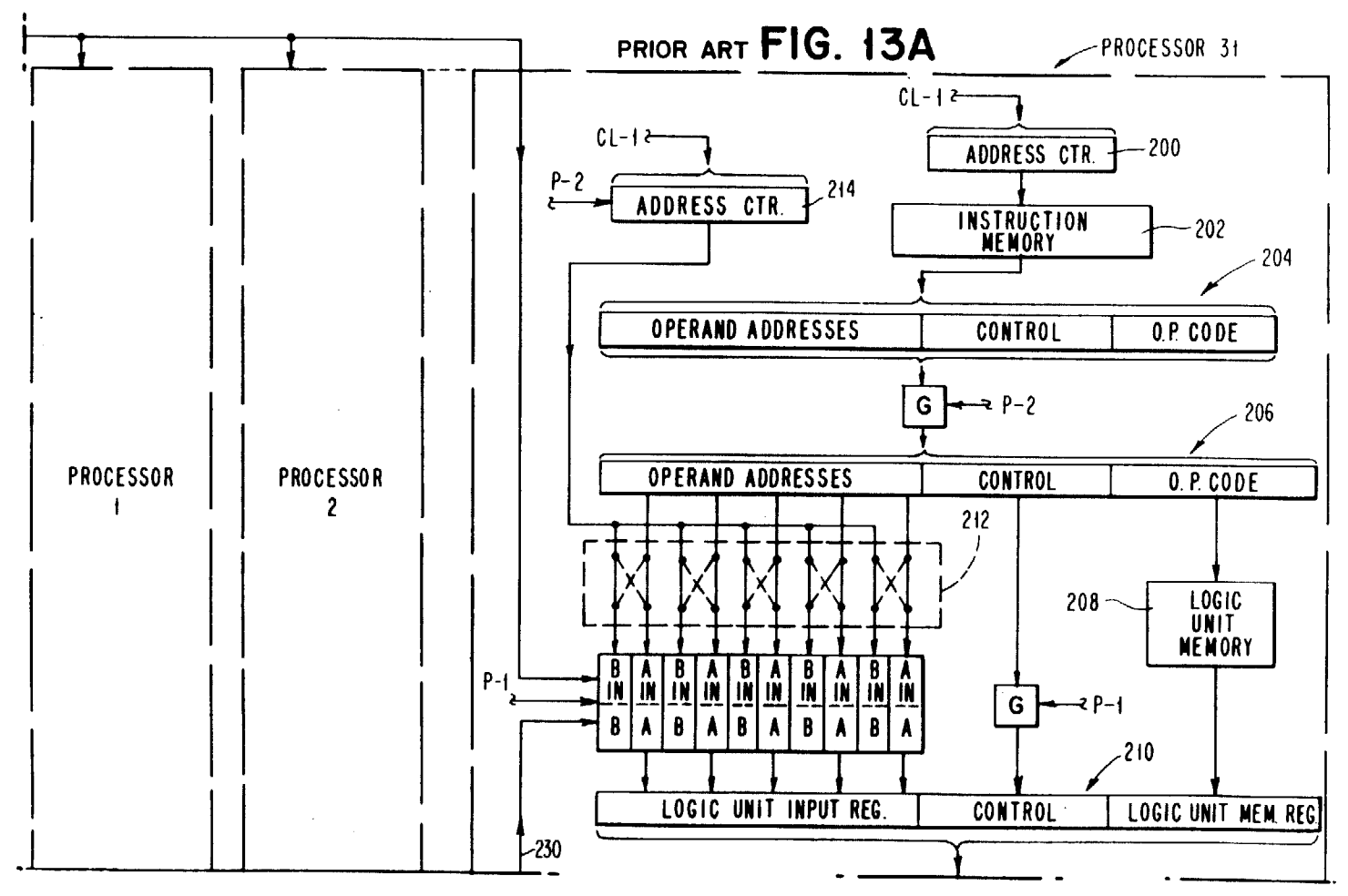

PRIOR ART FIG. 13A

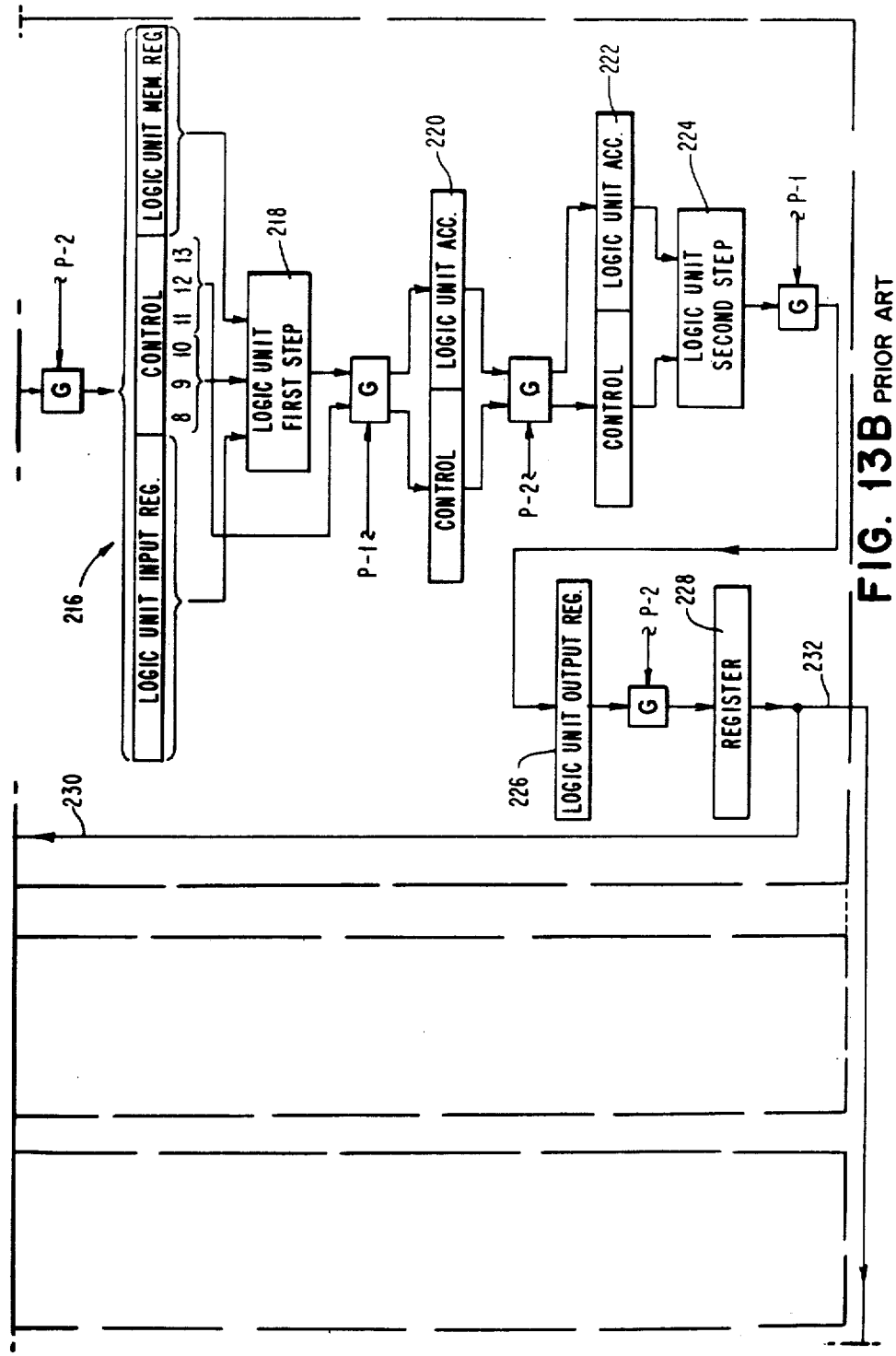

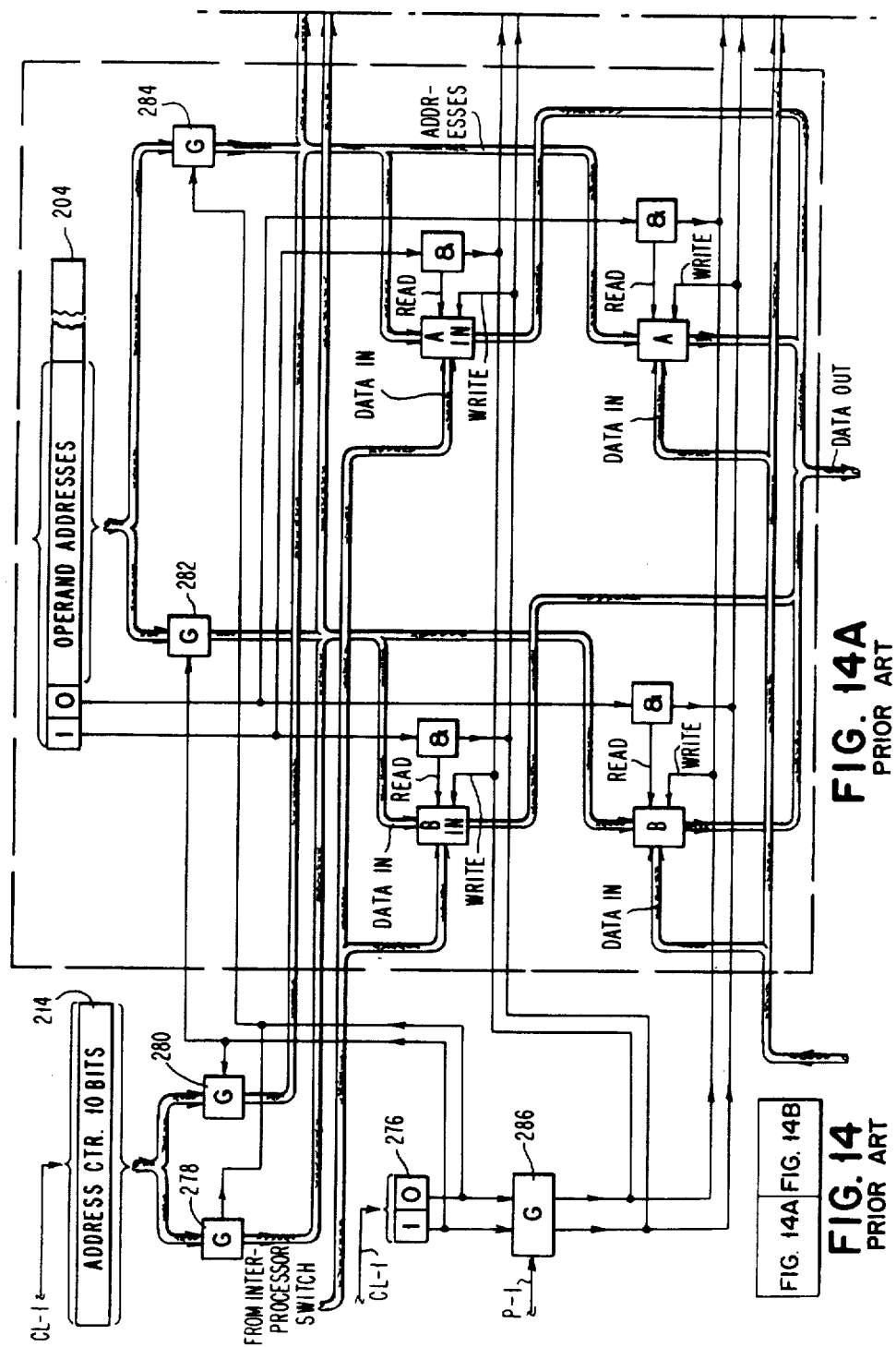

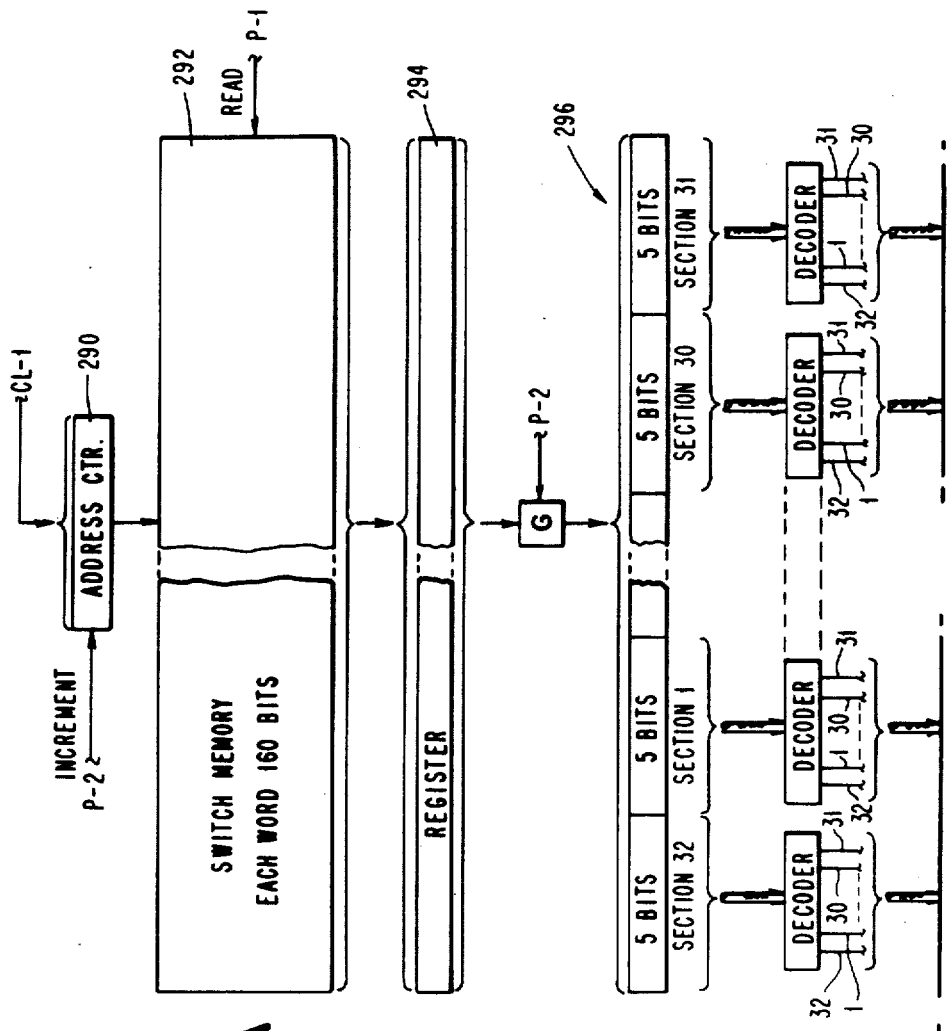

| ADDRESS | FUNCTION | ADR1 | ADR2 | LH | HL |
|---|---|---|---|---|---|
| 1 | NAND | 5 | 6 | 3 | 2 |
| 2 | NAND | 5 | 1 | 9 | 6 |
| 3 | NAND | 1 | 6 | 9 | 6 |
| 4 | NAND | 2 | 3 | 5 | 3 |

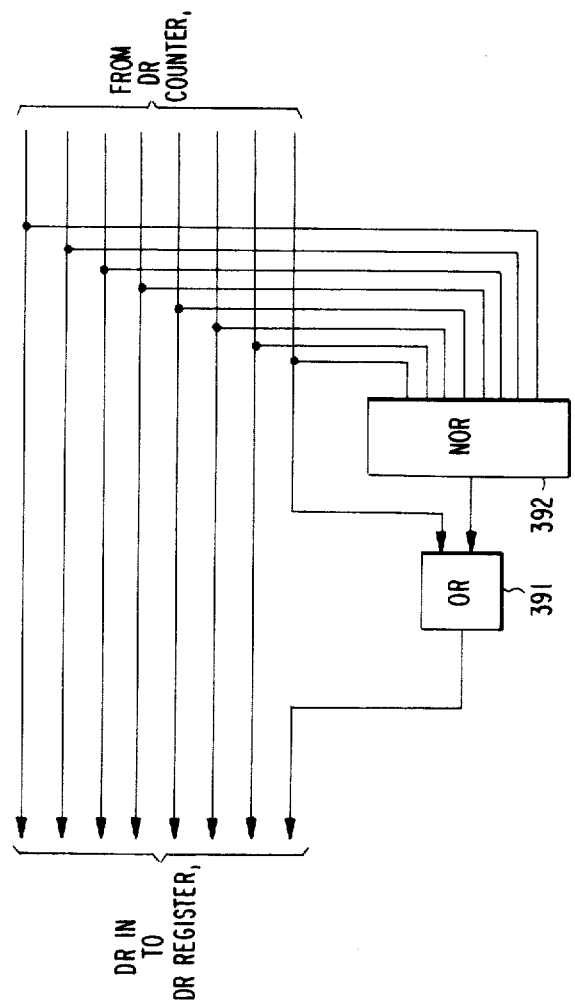

FIG. 25A (T=-2) WORK CYCLE 1

| MINOR CYCLE | $O_D(n)$ | $S_D(n)$ | $S_S(n)$ | WS(n) | Lu IN | Lu OUT | DR CTR | MIN.LATCHES 376-1 | 376-2 | $O_D(n+1)$ | $S_D(n+1)$ | $S_S(n+1)$ | WS(n+1) |
|---|---|---|---|---|---|---|---|---|---|---|---|---|---|
| 1 | * | * | 0 | * | 1 | 1 | 1 | A1 | A1 | 1 | 1 | 0 | * |
| 2 | * | * | 0 | * | 0 | 0 | 1 | A1 | A1 | 0 | 0 | 0 | * |
| 3 | * | * | 0 | * | 1 | 1 | 1 | A1 | A1 | 1 | 1 | 0 | * |
| 4 | * | * | 0 | * | 1 | 1 | 1 | A1 | A1 | 1 | 1 | 0 | * |
| 5 |   |   | 0 | 30 |   |   | 1 | 29 | A1 |   |   |   | 29 |
| 6 |   |   | 0 | 2 |   |   | 1 | 1 | A1 |   |   |   | 1 |

(T=0) WORK CYCLE 2

| 1 | 1 | 1 | 0 | * | 1 | 1 | 1 | A1 | A1 | 1 | 1 | 0 | 2 |
| 2 | 0 | 0 | 0 | * | 0 | 0 | 1 | A1 | A1 | 0 | 0 | 0 | 9 |
| 3 | 1 | 1 | 0 | * | 1 | 1 | 1 | A1 | A1 | 1 | 1 | 0 | 6 |
| 4 | 1 | 1 | 0 | * | 1 | 1 | 1 | A1 | A1 | 1 | 1 | 0 | 3 |
| 5 |   |   | 0 | 29 |   |   | 1 | 28 | A1 |   |   |   | 28 |
| 6 |   |   | 1 | 1 |   |   | 1 | 0 | A1 |   |   |   | 0 |

(T=1) WORK CYCLE 3

| 1 | 1 | 1 | 0 | 2 | 0 | 1 | 1 | A1 | 2 | 1 | 0 | 1 | 2 |
| 2 | 0 | 0 | 0 | 9 | 0 | 0 | 1 | A1 | 2 | 0 | 0 | 0 | 9 |
| 3 | 1 | 1 | 0 | 6 | 0 | 1 | 1 | A1 | 2 | 1 | 0 | 1 | 6 |
| 4 | 1 | 1 | 0 | 3 | 1 | 1 | 1 | A1 | 2 | 1 | 1 | 0 | 3 |
| 5 |   |   | 0 | 28 |   |   | 1 | 27 | 2 |   |   |   | 27 |
| 6 |   |   | 0 | 0 |   |   | 1 | 27 | 2 |   |   |   | 30 |

(T=3) WORK CYCLE 4

| 1 | 1 | 0 | 1 | 2 | 0 | 0 | 2 | 0 | A1 | 0 | 0 | 0 | 0 |
| 2 | 0 | 0 | 0 | 9 | 0 | 0 | 2 | 0 | A1 | 0 | 0 | 0 | 9 |
| 3 | 1 | 0 | 1 | 6 | 0 | 1 | 2 | 0 | 4 | 1 | 0 | 1 | 4 |
| 4 | 1 | 1 | 0 | 3 | 1 | 1 | 2 | 0 | 4 | 1 | 1 | 0 | 3 |
| 5 |   |   |   | 27 |   |   | 2 | 0 | 4 |   |   |   | 26 |
| 6 |   |   |   | 30 |   |   | 2 | 0 | 4 |   |   |   | 29 |

FIG. 25B (T=4)

| MINOR CYCLE | $O_D(n)$ | $S_D(n)$ | $S_S(n)$ | WS(n) | Lu IN | Lu OUT | DR CTR | MIN. LATCHES 376-1 | 376-2 | $O_D(n+1)$ | $S_D(n+1)$ | $S_S(n+1)$ | WS(n+1) |
|---|---|---|---|---|---|---|---|---|---|---|---|---|---|
| 1 | 0 | 0 | 0 | 0 | 0 | 0 | 1 | Al | Al | 0 | 0 | 0 | 3 |
| 2 | 0 | 0 | 0 | 9 | 1 | 0 | 1 | Al | 9 | 0 | 1 | 1 | 9 |
| 3 | 1 | 0 | 1 | 4 | 1 | 1 | 1 | 3 | 9 | 1 | 0 | 0 | 3 |
| 4 | 1 | 1 | 0 | 3 | 0 | 1 | 1 | 3 | 9 | 1 | 1 | 0 | 3 |

(T=7)

| MINOR CYCLE | $O_D(n)$ | $S_D(n)$ | $S_S(n)$ | WS(n) | Lu IN | Lu OUT | DR CTR | MIN. LATCHES 376-1 | 376-2 | $O_D(n+1)$ | $S_D(n+1)$ | $S_S(n+1)$ | WS(n+1) |
|---|---|---|---|---|---|---|---|---|---|---|---|---|---|
| 1 | 0 | 0 | 0 | 3 | 0 | 0 | 3 | Al | Al | 0 | 0 | 0 | 3 |
| 2 | 0 | 1 | 1 | 9 | 1 | 0 | 3 | 6 | 6 | 0 | 1 | 1 | 6 |
| 3 | 1 | 0 | 0 | 3 | 1 | 1 | 3 | 6 | 6 | 1 | 1 | 0 | 6 |
| 4 | 1 | 1 | 0 | 3 | 1 | 1 | 3 | 6 | 6 | 1 | 1 | 0 | 3 |

(T=13)

| MINOR CYCLE | $O_D(n)$ | $S_D(n)$ | $S_S(n)$ | WS(n) | Lu IN | Lu OUT | DR CTR | MIN. LATCHES 376-1 | 376-2 | $O_D(n+1)$ | $S_D(n+1)$ | $S_S(n+1)$ | WS(n+1) |
|---|---|---|---|---|---|---|---|---|---|---|---|---|---|
| 1 | 0 | 0 | 0 | 3 | 0 | 0 | 6 | Al | Al | 0 | 0 | 0 | 3 |
| 2 | 0 | 1 | 1 | 6 | 1 | 1 | 6 | 0 | Al | 1 | 1 | 0 | 0 |
| 3 | 1 | 1 | 0 | 6 | 1 | 1 | 6 | 0 | Al | 1 | 1 | 0 | 6 |
| 4 | 1 | 1 | 0 | 3 | 1 | 1 | 6 | 0 | Al | 1 | 1 | 0 | 3 |

(T=14)

| MINOR CYCLE | $O_D(n)$ | $S_D(n)$ | $S_S(n)$ | WS(n) | Lu IN | Lu OUT | DR CTR | MIN. LATCHES 376-1 | 376-2 | $O_D(n+1)$ | $S_D(n+1)$ | $S_S(n+1)$ | WS(n+1) |
|---|---|---|---|---|---|---|---|---|---|---|---|---|---|
| 1 | 0 | 0 | 0 | 3 | 0 | 0 | 1 | Al | Al | 0 | 0 | 0 | 3 |
| 2 | 1 | 1 | 0 | 0 | 1 | 1 | 1 | Al | Al | 1 | 1 | 0 | 6 |
| 3 | 1 | 1 | 0 | 6 | 1 | 1 | 1 | Al | Al | 1 | 1 | 0 | 6 |
| 4 | 1 | 1 | 0 | 3 | 0 | 1 | 1 | Al | 3 | 1 | 0 | 1 | 3 |

(T=17)

| MINOR CYCLE | $O_D(n)$ | $S_D(n)$ | $S_S(n)$ | WS(n) | Lu IN | Lu OUT | DR CTR | MIN. LATCHES 376-1 | 376-2 | $O_D(n+1)$ | $S_D(n+1)$ | $S_S(n+1)$ | WS(n+1) |
|---|---|---|---|---|---|---|---|---|---|---|---|---|---|
| 1 | 0 | 0 | 0 | 3 | 0 | 0 | 3 | Al | Al | 0 | 0 | 0 | 3 |
| 2 | 1 | 1 | 0 | 6 | 1 | 1 | 3 | Al | Al | 1 | 1 | 0 | 6 |
| 3 | 1 | 1 | 0 | 6 | 1 | 1 | 3 | Al | Al | 1 | 1 | 0 | 6 |
| 4 | 1 | 0 | 1 | 3 | 0 | 0 | 3 | 0 | Al | 0 | 0 | 0 | 3 |

| 82 | 1 | 10 |
| 80 | 0 | 17 |
| 81 | 0 | 6 |
| 82 | 0 | 100+ |
| 81 | 1 | 100+ |
| 80 | 1 | 100+ |

LOGIC SIMULATION MACHINE

BACKGROUND OF THE INVENTION

The present invention relates to a logic simulation machine, which is a special purpose, highly parallel computer for the gate level simulation of logic. The logic simulation machine may operate in combination with a host computer and a local computer which are used to provide loading functions and to analyze the results of the simulation. The logic simulation machine includes a plurality of separate basic processors and a control processor interconnected by a switch.

Logic technologies such as very large scale integrated circuits and Josephson technology provide significant improvements in cost/performance and reliability. However, they have disadvantages in that fault diagnosis thereof is more difficult than previous technologies and engineering rework cycles needed to correct faults in logic design are greatly lengthened. These disadvantages exact great economic penalties for design errors and omissions and place a greater emphasis on the goal of completely verifying design in advance of engineering models.

One technique for providing design verification is simulation; however, this approach has certain disadvantages. It lacks the absoluteness of static verification or any other technique actually proving correctness. The presence of errors, not their absence, is all testing can show, and it is expensive in computer resources and time consuming. Even with high-level software simulation, it is not feasible to run even short hardware diagnostic programs.

However, if the cost of simulation is decreased drastically and the speed and capacity are increased by orders of magnitude, the situation is altered radically. Since an entire processor can be simulated, far more stringent verification is possible through execution of substantial software tests. Also, logic can be tested while embedded in a standard processor design, simplifying test sequence creation and effectively providing personal engineering models. Other advantages also arise. Thus, simulation of faults can be used to derive and verify manufacturing and field tests much more economically.

U.S. Pat. No. 4,306,286, issued Dec. 15, 1981, to Cocke et al. and assigned in common with the present application, describes a logic simulation machine composed of a plurality of parallel processors and a control processor which is capable of simulating a large variety of logic functions. The present invention is an improvement upon the logic simulation machine described in the Cocke et al. patent. As such, the logic simulation machine of Cocke et al. will hereinafter be described in detail.

The logic simulation machine of the Cocke et al. patent is a special purpose, highly parallel computer for the gate level simulation of logic. It provides logic simulation speeds far beyond those of earlier software logic simulators. The embodiment thereof to be described includes thirty-one processors which simulate one gate delay for 31K gates.

Since that logic simulation machine is not a general purpose computer, it must be used as a device attached to a computer which can perform for it functions such as compilation, input/output control, etc. The system in which the logic simulation machine is used may for instance, contain two computers in addition to the logic simulation machine.

The two other computers used in the logic simulation machine may be on an IBM System/370 "host" computer and a local computer connected as an interface between the logic simulation machine and the 370 host computer. The local computer may be IBM Series/1 Model 5 minicomputer. Although two general purpose computers are shown in the following description in alternative embodiments their functions may be performed by one general purpose computer such as the IBM 801. The functions performed by the two general purpose computers are to load the logic simulation machine with data and instructions and to analyze the results that the logic simulation machine has obtained in a manner known in the data processing art.

More particularly, the System/370 host computer provides large computation and file support functions such as user interface control, command parsing, EXEC execution, result display, etc., compilation of logic simulation machine code and input test sequences, file storage and management, and communication with the local computer. The local computer provides fast turn-around functions, such as control of logic simulation machine execution, e.g., single-cycle execution, communication with the host computer, simulation of large storage arrays (control store, main memory, etc.), application of test input sequences, capture of test output results and insertion/removal of logic faults in the fault simulation mode.

Information passed between the logic simulation machine and the host computer is not interpreted by the local computer. The host computer compilation generates information in a form which is directly usable by the logic simulation machine and which can be transmitted through the local computer with no change.

The local computer and the host computer are standard machines and are controlled by programs, therefore, their contribution to the system is conventional. Also, it is possible for the logical simulation machine to have its instructions and data loaded by manual means and its results analyzed by manual means.

Referring to FIG. 1, the logic simulation machine of the Cocke et al. patent is shown in block diagram form. The machine includes a plurality of basic processors, the number of which may vary although thirty-one processors are shown as an example. The thirty-one basic processors are connected to a thirty second processor referred to as a control processor through an inter-processor switch. The plurality (thirty-one) of basic processors are the computing engines of the logic simulation machine; they simulate the individual gates of the design. All the basic processors run in parallel, each simulating a portion of the logic and each basic processor can simulate up to 1024 single output functions. Because the basic processors run in parallel, increasing their number does not decrease the simulation rate, but may, in alternative embodiments, be used to increase it.

There is one control processor (processor 32 in FIG. 1) provided in a logic simulation machine. It provides overall control and input/output facilities. Responding to I/O commands from the Series/1, the control processor performs the functions of starting and stopping the basic processor, loading the basic processor switch instructions and data and transferring input and output data between the basic processors and the local computer, re-ordering the data for simpler processing by the local computer. In addition the control processor interrupts the local computer in response to events occurring during the simulation. Such events include the end of the simulation, requests for array simulation within the local computer, and the occurrence of user-defined break-points.

There is one inter-processor switch 33 in the logic simulation machine. It provides communication among the thirty-one basic processors and between them and the control processor 32. Its primary purpose is to communicate simulated logic signals from the basic processor generating them to the basic processor using them. In addition, it provides communication between the basic processors 1-31 and the control processor 32 for loading the basic processors, transferring inputs and outputs to the local computer, etc.

In the next section of this description the basic processors 1-31, inter-processor switch 33 and control processor 32 of the logic simulation machine are described on a block diagram level with reference to FIG. 1, then a more detailed description is presented with reference to the schematic drawings of FIGS. 2 through 8.

Basic processors (1 through 31 in FIG. 1) are the computing engines of the logic simulation machine: each simulates the individual gates of a portion of the logic. The simulation results are also communicated among the various processors.

The data on which a basic processor operates represent logic signal values. Each datum can represent three values: logical 0, logical 1, and undefined. "Undefined" indicates that the represented signal could be either logical 0 or logical 1. The three values are coded using two bits per datum as follows:

| BIT 0 | BIT 1 | VALUE |
|-------|-------|-----------|
| 0     | 0     | logical 0 |
| 1     | 0     | logical 1 |
| 0     | 1     | undefined |
| 1     | 1     | undefined |

Either of the two "undefined" combinations may be initially loaded into a basic processor, and a basic processor may produce either as a result during simulation.

Since bit 1 distinguishes the undefined combinations, it is referred to as "the undefined bit." Since bit 0 distinguishes logical 0 from logical 1, it is referred to as "the value bit."

The use of 00 as logical 0 and 10 as logical 1 is a convention; the reverse could be used. However, the use of combinations 01 and 11 to represent undefined values is not a convention; it is built into the basic processor hardware.

The data representation described above is uniformly used throughout the logic simulation machine to represent logic signals.

As illustrated in FIG. 1, each basic processor such as processor 1 has a plurality of internal memories with a logic unit 34 connecting them. Two of these memories are two identical logic data memories which alternately assume one of two roles; that of the current signal value memory 35 and that of the next signal value memory 36. For a clearer explanation of the logic simulation machine, the functions of the logic data memories will be described in terms of these roles.

The current and next signal value memories 35 and 36 contain logic signal representations. Both have 1024 locations, each holding one signal.

The data in current signal value memory 35 are the logic signal values that are currently present in the simulation. The logic unit updates those values, placing the results in the next signal value memory.

The process of updating all the signal values is called a major cycle. The simulation proceeds in units of major cycles, each of which corresponds to a single gate delay. At the conclusion of each major cycle, the logic simulation machine may halt; if it does not, the former next signal value memory is designated to be the current signal value memory (and vice versa) and another major cycle is performed. (It may be noted at this point that the major cycle as used in the Cocke et al. machine is later redefined for purposes of the present invention as a "work cycle", which need not correspond to a fixed time period in simulation. This will be discussed below in more detail.)

Another component of the basic processor of FIG. 1 is the instruction memory 202. The logic unit 34 uses the instruction memory 202 in computing updated logic signal values. The instruction memory has 1024 locations, each containing a single logic simulation machine instruction corresponding to a single 1-output, 5-input gate.

Each logic simulation machine instruction contains a function code field, referred to as the opcode, and five address fields. The function code specifies the logic function to be performed, e.g., AND, NOR, XOR, etc.; this is discussed in more detail hereinafter. The five address fields specify input connections to a gate.

To perform a major cycle, the logic unit 34 sequences through instruction memory 202 in address order, executing each instruction by computing the specified logic function on the five specified values from current signal memory. The result of each instruction is placed in next signal value memory 36 at the address equal to the instruction (representing a gate). For example, the instruction at address X has its result (representing the gate's output) placed at next signal value memory 36 address X; and the gate's output one gate delay earlier resides at current signal value memory 35 address X.

Each execution of an instruction by the logic unit is referred to (somewhat informally) as a minor cycle.

It is important to note that instructions can be executed in any order, i.e., their placement in the instruction memory is arbitrary. This is true because updated values are placed in a separate memory, and there are no branch, test, etc., instructions. This is true because updated values are placed in a separate memory, and there are no sequences for communication between basic processors as will be discussed later.

Instructions have fields other than the function code and 5 addresses. These fields are used to perform "dotted" logic and to simulate gates with more than 5 inputs. When these fields are used, instruction execution order is no longer completely arbitrary. These fields are discussed in later sections.

The operation of a basic processor of FIG. 1 will be described using, as an example, the circuit shown in FIG. 2, which includes four NAND gates.

In FIG. 2, the numbers on the output sides of the gates are the locations in instruction memory of the instructions representing the gate. They are also the locations in current and next signal memory holding the simulated gate outputs. Inputs are assumed to come from locations 5 and 6. (The numbers above the gates represent delay times through the gates. These will be discussed in more detail below in the Description of the Preferred Embodiments. For the present discussion, and as is universally true in the logic simulation machine of Cocke et al., a unit gate delay is assumed for both high-to-low and low-to-high signal transitions.)

The instruction memory contents required for simulation are shown (simplified) in the table of FIG. 3.

Addresses 3 through 5 of each instruction in FIG. 3 are left blank because they are unused in this example; in practice, they might be set to addresses containing constant logical 1's (because the gates are NAND gates).

The table shown in FIG. 4 lists the contents of current signal values undefined (shown as asterisks). The gradual extinction of undefined values shows how logic values propagate through the gates. It should be noted that gate 2 output is fully defined at cycle 2, since a NAND gate with a 0 input has an output of 1 independent of its other inputs.

When a simulation does not require all of the instruction memory locations, the logic unit may execute fewer than the maximum of 1024 instructions per major cycle. This shortens each major cycle, increasing the simulation speed.

The major cycle length is controlled by a minor cycle count register to be described in more detail hereinafter, which contains the address of the last instruction to be executed in each major cycle (plus a "skew" value). There is a single minor cycle count register for the entire logic simulation machine; it controls the major cycle length in every basic processor.

Use of the minor cycle register to control major cycle length permits the feature of increasing the number of basic processors to increase the simulation speed.

The logic functions specified in the logic simulation machine instructions are defined by the contents of another basic processor memory, the function memory 37 shown in FIG. 1. The relation of the function memory 37 to other basic processor elements is illustrated in FIG. 1.

Each distinct logic function used in a basic processor during a simulation is defined by the contents of a single location in function memory 37. The function code (opcode) of each instruction is the address in function memory 37 of the function's definition.

In the initial implementation of the logic simulation machine, the function memory 37 has 1024 locations. Each location contains 64 bits, one for each truth table entry of a 6-input switching function. (The sixth input is used in the simulation of gates with more than five inputs, described in a later section.) The truth table values in the function memory are 0 and 1; "undefined" values are generated by the logic unit in response to "undefined" input values. For example, assume that all the inputs to an AND function are undefined except for one. If that defined input is 1, the output is undefined. If that defined input is 0, the output is defined and equal to 0.

It is to be noted that since each instruction's function code selects an arbitrary location in function memory 37, there is no necessary one-to-one correspondence between instruction memory 202 and function memory 37 locations. Furthermore, there is no requirement that the function memory 37 have the same number of locations as the instruction memory 202 and the signal value memories. There must, however, be a one-to-one correspondence between instruction addresses in the instruction memory and the address into which its result is stored.

Gates of more than five inputs (extended functions) are simulated using facilities internal to a basic processor's logic unit. A diagram of the relevant internal structure appears in FIG. 5.

The function evaluation element of the logic unit computes the result of applying a function (truth table) to logic values. On each minor cycle (instruction execution) the output of function evaluation is stored in the logic unit. There is a sixth logic value input to the function evaluation element. The data presented to this input may be either the previous instruction's result (logic unit accumulator contents) or the contents of an immediate data field in each instruction. The choice is determined by each instruction's immediate select flag: 0 selects the logic accumulator contents, and 1 selects the immediate data field. The small box labelled X in the figure represents this choice of input.

A gate with 5 (or fewer) inputs is represented by a single instruction with an immediate select flag of 1. The function definition used must either ignore the constant sixth input or allow it to be some value that will not affect the result when only 5 inputs are used. That is, an immediate logical 0 allows a 6-input OR function definition to be used to simulate 5-input OR gates.

A gate with more than 5 inputs must be represented by two or more successive instructions. The second through last instructions all use the preceding instruction's results (logic unit accumulator contents) as their sixth input. Prior instruction results are stored in the next signal value memory, but do not correspond to elements of the simulated machine.

For example, suppose a 15-input NOR gate is to be simulated. Assuming its inputs come from locations 101 through 115, an appropriate instruction sequence is shown in the table of FIG. 6.

The fist instruction in the table selects an immediate logical 0 as its sixth input. The other two use the previous instructions' output as the sixth input, so their immediate fields are irrelevant (indicated by X's in the table). The functions shown (two ORs followed by a NOR) cause the last instruction's output to be the NOR of all 15 inputs.

It is to be noted that no other instructions may intervene in a sequence of instructions computing a function of more than five inputs in this manner, since they would destroy the logic accumulator contents. This method of simulating extended functions corresponds to a functional decompostion that is easy to perform for the most common logic primitives: AND, OR, NAND, NOR, EXOR, etc. For those primitives, the decomposition needed follows directly from the associativity of AND, OR and EXOR, e.g., the decomposition used in the fifteen input NOR example above was:

NOR(A,B,C,D,E,F, ...
)=NOR(OR(A,B,C,D,E,),F, ...).

For more general functions, the needed decomposition is more difficult to find, if it exists at all. Simulation of such more general functions can be done in a straightforward fashion by use of the logic simulation machine facilities for "dotted" logic presented in the next section.

"Dotted" (or "wired," or "wire-tied") logic, performed in hardware by directly connecting gate outputs, can be simulated by use of logic unit elements labelled Dotting Logic and Dot Accumulator in FIG. 7. These elements are controlled by three flags in each instruction: the SAVE FOR DOT flag, the DOT SELECT flag, and the DOT FUNCTION flag.

When SAVE FOR DOT is 1, the output of the logic unit for the instruction is stored in the Dot Accumulator. Otherwise, the instruction does not modify the Dot Accumulator.

When DOT SELECT is 1, the output of the logic unit, which is the value stored in next signal value memory, is a function (AND or OR) of the current Dot Accumulator contents and the output of the current instruction (logic unit accumulator contents). This final value may be saved in the Dot Accumulator by using the SAVE FOR DOT flag.

DOT FUNCTION defines the "dotted logic" function performed: DOT FUNCTION=0 selects AND, and DOT FUNCTION=1 selects OR (assuming the convention that 00 is logical 0 and 10 is logical 1; the opposite convention reverses the DOT FUNCTION meanings). DOT FUNCTION is active only when DOT SELECT is 1.

As an example, reference is made to FIG. 8, which shows a 3-way collector dot ("dotted OR"). The numbers near the gates are instruction memory addresses for instructions representing the gates; the numbers at the inputs are addresses of the input data, and the number at the output is the address where the final dotted result is placed in next signal value memory.

The table of FIG. 9 shows instructions implementing the simulation of dotting for the example. Unused inputs have been left blank for clarity, and the immediate select and immediate value fields are left out also since they are not relevant to the example.

The first instruction in the table just saves its result. Its DOT FUNCTION flag is immaterial (indicated by an X) since its DOT SELECT flag is 0. The second instruction ANDs its result with the saved first instruction's result and saves that. (Note that AND is used since the common term "wired OR" actually refers to the opposite logic convention.) The third instruction also ANDs its result with the saved dotting result; its output is the final dotted logic result, so it is not saved for further dotting.

Note that several instructions can intervene between two whose outputs are to be "dotted" together, providing they do not alter the dot accumulator. This allows the simulation of "wired logic" between gates of more than five inputs.

The dotted logic facilities of the logic simulation machine can also be used in simulating gates with more than 5 inputs. This is particularly useful for simulating gates implementing complex functions since a decomposition into product-of-sums or sum-of-products form can be the basis of the representation used. Individual instructions perform the first level of the decomposition (the several sums or products), and the dotting logic is used to perform the second level (the single outer level product or sum).

It was previously stated that the order of instructions in the instruction memory was not relevant. This is clearly not true for sequences of instructions using the logic unit accumulator and dot accumulator. However, such sequences are typically needed only to simulate a small minority of a device's logic, and a sequence as a whole can be arbitrarily postioned in instruction memory.

The primary function of the inter-processor switch 33 of FIG. 1 is to communicate instruction results from the basic processors, delivering them to basic processors using them. That function will now be described.

The inter-processor switch 33 connects all the basic processors 1–31 and the control processor 32. This is illustrated in FIG. 1.

The communication of results between processors makes use of additional memories within each basic processor as shown in FIG. 1. The function of these memories in providing inter-processor communication through the switch is described below.

As illustrated in FIG. 1, each basic processor has two additional internal logic data memories. These are identical to the current and next signal value memories 35 and 36 previously discussed. Like the signal value memories 35 and 36, these additional memories alternately assume one of two roles, that of the current signal input memory 38 and that of the next signal input memory 39. Their functions will be described in terms of these roles. The actual data memories have been called the A-IN memory and the B-IN memory.

Like the signal value memories 35 and 36, the current and next signal input memories 38 and 39 contain representations of logic signals. Both have 1024 locations, each holding one signal.

The data in current signal input memory 38 are logic signal values that are currently present in the simulation, and were generated by other basic processors. This data is selected by use of ADDRESS SOURCE flags in each basic processor instruction. Each of the five addresses in an instruction has an associated ADDRESS SOURCE flag. When it is 0, the address references data in current signal value memory; when 1, the address references data in current signal input memory. Thus any or all of the data used in computing a logic function can come from other processors.

In the course of a major cycle, updated values are obtained from the inter-processor switch 33 and placed in the next signal input memory 39, and at the end of each major cycle, the former next signal input memory is designated to be the current signal input memory (and vice versa).

The switch select memory 40 of each basic processor has 1024 locations, each containing the address of a basic processor. The inter-processor switch 33 uses the switch select memory 40 to place updated logic signal values in the next signal value memory 36 as follows. The result of each instruction, the value stored in a basic processor are synchronized: every basic processor executes its Kth instruction at the same time. Thus, all processor's results are sent to the inter-processor switch 33 simultaneously, in the order of their addresses in next and current signal value memories 36 and 35.

The switch select memory 40 and next signal input memory 39 are also stepped through in address order, synchronized with instruction execution. At each minor cycle, the switch sends to each basic processor the current output of the basic processor address by the current switch select memory 40 location. This output is placed in the current location in next signal input memory 39. Thus, if a basic processor's switch select memory 40 has Q in location Z, it receives the Zth output of basic processor Q; this is placed in location Z of its next signal input memory 39.

The tables shown in FIGS. 11 and 12 show the switch select memory 40 and instruction memory 202 contents providing the required communication for the circuit shown in FIG. 10, assuming the allocation to processors shown in FIG. 12. The numbers in FIG. 12 are instruction/data locations corresponding to the gates and signal lines shown. Unused elements have been left out of the instructions for clarity.

Since processor 3 needs processor 2's 49th output, the table of FIG. 11 shows processor 3's 18th instruction accessing that location with FIG. 11 showing a 2 in processor 3's 49th switch select memory location. This places the needed value in processor 3's 49th next signal input memory 39, so the table of FIG. 11 shows processor 3's 18th instruction accessing that location with its second address. The other table elements are derived similarly. It should be noted that at minor cycle 18, processor 1 simultaneously transmits and receives, sending data to processors 2 and 3 and obtaining it from processor 3.

Suppose a basic processor needs data generated in two other processors, and they generate it at the same minor cycle (same instruction location). The needed communication cannot be performed, since a basic processor can receive the output of only one other processor at each minor cycle.

However, instruction execution order is arbitrary (except for extended functions and "dotted" logic), so instructions can be ordered in instruction memory 202 to avoid such conflicts. The problem of discovering such an ordering is called the scheduling problem. The scheduling problem must be solved by the logic simulation machine compiler for each device to be simulated. Just as physical components, must be placed and wired, simulated logic must be partitioned among the processors and scheduled.

Partitioning and scheduling is readily achieved in the logic simulation. Communication can be scheduled even when extremely simple partitioning is used, such as, placing the first N gates in processor 1, the next N in processor 2, etc. Even examples containing substantial use of the logic accumulator may be successfully scheduled using this simple partitioning.

The control processor 32 of the logic simulation machine provides two functions of particular interest, they are organizing signal values into functional groups so that they can read from or written into the logic simulation machine with a single local computer (Series/1) input/output operation, and halting the logic simulation machine and interrupting the local computer when any of a group of selected signals are set to specified values.

The first function provides for efficient application of input sequences and gathering of data by the local computer. The halting function is the basic mechanism for informing the local computer of events in the simulation such as user-defined events or requests for array read or write. The control processor including these two functions is discussed as follows.

The control processor 32 contains two counters which are of use in controlling overall logic simulation machine execution.

The control processor also provides general logic simulation machine control functions, such as starting the logic simulation machine, halting it, etc. These are provided via commands from the local computer which utilize the control processor in a transparent manner.

The control processor contains six memories referred to as a switch select memory, an output signal memory, an input permutation memory, and an event mask.

The characteristics and functions of each of these memories are described below.

The switch select memory of the control processor and its connection to the inter-processor switch 33 are identical in configuration and operation to switch select memory 40 of a basic processor switch 33 from the control processor 32 each minor cycle; and the control processor's switch select memory determines the basic processor from which it receives data each minor cycle.

The input and output signal memories serve as a sink and a source, respectively, of logic data communicated between the control processor 32 and the basic processors 1–31 via the inter-processor switch 33. Both have 1024 locations, each holding a single signal.

In contrast to other signal data memories in the logic simulation machine, no internal logic simulation machine action ever reads the contents of the input signal memory; it is read only into the local computer main storage via its input/output operations. Similarly, no internal action ever alters the contents of the output signal memory; it is loaded only from the local computer main storage via its input/output operations. In addition, no swapping of these memories occurs between major cycles.

The function of the input and output permutation memories is to permute the transmission order of values in the input and output signal memories respectively. Each of the memories contains 1024 locations of 10 bits each; an address in the associated signal memory is contained in each location.

Every major cycle, the input permutation memory is cycled through in address order, synchronized with basic processor instruction execution. The address in the current input permutation memory location is used as the address in input signal memory where data currently received from the inter-processor switch is placed. The output permutation memory is cycled through in the same manner. The contents of each location is used as the address in the output signal memory from which data is sent to the inter-processor switch 33.

This permutation of signal order allows data to be functionally grouped in the output signal memory, minimizing the local computer input/output operations needed to alter it. Such functional grouping might otherwise be impossible to achieve, due to the requirements of scheduling inter-processor data transfers through the inter-processor switch 33. For example, a set of test inputs can be positioned in contiguous locations of the output signal memory and stored there with a single local computer input/output operation; appropriate output permutation memory contents can then feed that data to the switch at the minor cycles to which they have been scheduled for conflict-free inter-processor communication.

The event mask in control processor 32 allows the logic simulation machine to halt in response to events in the simulation itself, i.e., the setting of some simulated signal(s) to selected value(s).

The event mask contains 1024 locations of 4 bits each. Each of the bits corresponds to an individual value of the 2-bit code for simulated signal values: the first bit corresponds to 00, the second to 01, the third to 10, and the last to 11.

The event mask, in parallel with the output and input permutation memories of control processor 32, is cycled through in address order as part of a major cycle. As each signal value is received from the inter-processor switch 33, it is matched against the contents of the current event mask location. If that location contains a "1" corresponding to the signal value, the simulator is halted at the end of the current major cycle and an interrupt is presented to the local computer.

It should be noted that event mask locations correspond to signal values in the order they are received from the switch, not in the (permuted) order of storage in input signal memory.

Since the event mask can have more than a single "1" in each location, any of several values of a particular signal can be made to cause the simulator to halt. For example, the simulator could be halted when a particular signal is set to anything except logical 0.

Since the logic simulation machine only halts at the end of a major cycle, thus ensuring consistency of all simulated signal values, more than one signal value can match the event mask settings before the halt and interrupt, effectively causing a halt for several reasons simultaneously. For this reason, the local computer is given no direct indication as to which signal value caused the halt. Instead, controlling software in the local computer must read the contents of the input signal memory to determine which signal value(s) caused the halt. This implies another use of the output permutation memory: all the simulated signal values which could cause a halt can be grouped in input signal memory and thus read by a single local computer input/output operation.

The control processor also contains two identical counters called level counter 1 and level counter 2, each 16 bits long. They can be loaded via local computer input/output commands, and are decremented each major cycle. When either reaches 0, the local computer is interrupted.

These counters can be used for various purposes. For example, one can count the major cycle (gate delays) per logic cycle of the simulated device, giving the Series/1 and an interrupt when it is time to gather an output vector and apply a new input vector. The other can count the total number of major cycles a simulation is to run.

A more detailed description of the logic simulation machine shown in block diagram form in FIG. 1 will now be provided. FIGS. 13A, 13B, 13C and 13D illustrate the entire logic simulation machine and FIG. 13E is an illustration of waveforms used in the description of FIGS. 13A through 13D.

Referring to FIGS. 13A and 13B, and as previously stated, there are thirty-one processors numbered from number 1 to number 31 as also shown in FIG. 1, processor number 31 is shown in diagrammatic form on FIGS. 13A and 13B.

Also as previously stated, the actual number of the just mentioned processors is not important. There could be more processors or less. The number of thirty-one processors is chosen as one example of a practical machine embodiment of the invention. In addition to the processors number 1 through 31, there is control processor 32 also shown in FIG. 1, which is shown on FIGS. 13C and 13B. Control processor 32 will be described in detail later, and as previously stated is used mainly to accumulate the results and to provide the control pulses which are needed for the entire logic simulation machine of this embodiment.

In FIG. 13A, the address counter 200, is used to supply addresses to the instruction memory 202. In memory 202 has provisions for 1024 words. This number is only used as an example, and a greater or lesser number of words may be used. Actually, in the operation of the described machine, the total number of 1024 words in the instruction memory 202 may not be used as will be understood in the later description.

From the instruction memory 202, words are read into the instruction register 204. Because of the pipe-lined structure of the machine, a second instruction register 206 is needed into which the same word is read by the P-2 gate pulse also illustrated in FIG. 13E. The register 206 then acts as an input register to the "logic unit memory" 208 and to the memories labelled A, B, A IN and B IN. The left-hand section of register 206 holds five operand addresses. The middle section of this register holds some control bits and the right-hand portion holds the operation code. The operation code in the right-hand portion of register 206 acts as an address to the logic unit memory to place a word in the "logic unit memory register" section of register 210. The control section is passed from register 205 to register 210 by the P-1 gate pulse which is also shown in FIG. 13E. The A and B memories and their sections A IN and B IN are special memories and will be described more in detail later. At this point in the description, it can be mentioned that either the A and A IN or the B and B IN memories can be read and placed in the "logic unit input register" of register 210, As previously described, and as will be explained in more detail later, there are "minor cycles" and "major cycles" in the logic simulation machine operation. During a "minor cycle" one instruction in the instruction memory 202 on FIG. 13A is read and processed. A "major cycle" can consist of 1024 of these "minor cycles". The A, B, A IN and B IN memories are used alternately. For example, during one major cycle the A and A IN memories may be read from, while in a next successive major cycle the B and B IN memories are read from.

In the next "major cycle" the B and B IN memories will be read. The switching between the A and A IN and the B and B IN memories is accomplished by the switching mechanism indicated by the dotted line 212 on FIG. 13A. If it be assumed that, in a certain major cycle, the A and A IN memories are read out of in this same major cycle, the B and B IN memories can be read into. When the A and A IN memories are read out of, these memories are regarded as a single memory. A and A IN memories are both memories addressed by the low order ten bits of the operand in register 206 while the high order bit of this same operand selects which of two (A or A IN) memories is actually read. In other words, the operands in register 206 are eleven bits. When the A, A IN, B or B IN memories are written into, each one of these memories are regarded as separate memories and are both addressed by ten bits which is contained in the address register 214 on FIG. 13A. These memories will be described in much more detail later on in the description.

Referring again to FIG. 13A, information in register 210 is transferred to register 216 by the P-2 gate pulse. This permits the information in register 216 to be applied to the LOGIC UNIT FIRST STEP. This "logic unit first step" 218 will be described in more detail later. The output of the "logic unit first step" 218 and also the control bits numbers "11", "12" and "13" are transferred to 220 on FIG. 13B by the P-1 gate pulse. From register 220 these data are gated to register 222 by the gate pulse P-2. Register 222 serves as the input register for the "logic unit second step" 224, The "logic unit second step" 224 will be described in more detail later. From this unit, the results are gated to the logic unit output register 226 by the pulse P-1.

From register 226, information is gated to register 228 by the P-2 gate pulse. These delay registers are necessary in the machine because of the "pipelining" used in the design. From register 228 it can be seen that data has two paths. One is back to the processor via cable 230 so that information can be written into either the A or B memories according to the setting of the switches represented by reference character 212. The other path for data is via cable 232 which goes to the inter-processor switch. Depending on the setting of the gates in the inter-processor switch 33 shown in FIG. 1, information can be gated from any processor back to itself or to any other processor in the group from processor number 1 through processor number 32. When this information comes in from the inter-processor switch 33 it always goes into either the A IN or the B IN memories. The inter-processor switch will be described in more detail later.

Reference should next be made to FIGS. 13C and 13D for the description of the control processor 32. Control processor 32 permits and accumulates information produced by the other thirty-one processors, keeps track of "events" and contains all the pulse generation equipment used to control the whole machine of this embodiment. On FIG. 13C, the "address counter" 234 is used to address the "permuter instruction memory" 236 which again can contain up to 1024 words. This memory is read by the P-1 gate pulse and the memory word is placed in the register 238. From register 238 the information is gated to register 240 by the P-2 gate pulse. Register 250 controls the reading and writing of the A and A IN memories and also provides an input to the "event logic" which is shown in detail on FIG. 16.

The A and A IN memories are used differently in processor number 32 than in the other thirty-one processors. The data is always read out of memory A and goes by cable 242 to the inter-processor switch. The data from the switch is written into memory A IN. In FIG. 13C, it will be noted that data coming in from the inter-processor switch 33 on cable 344 is not only applied to the memories but also serves as an input to the event logic.

Referring to the right side of FIG. 13D, the logic simulation machine of this embodiment is started by a "start" applied to the lead 246. This pulse extends through the or circuit 248 to turn "on" single shot device 50, This produces the CL-1 pulse shown in FIG. 13E which is used to reset the address counters to trigger the "swap" switch. The "swap" switch is used to switch the A and B memories in the various processors. The CL-1 pulse is also used to set the event latch 260 to its 0 state and also to reset to 0 the count up counter 264. After the CL-1 pulse disappears, the delay circuit 252 will have an output to turn "on" single shot device 254 in order to produce the CL-2 pulse. The CL-2 pulse sets the flip flop 256 to its 1 state thus turning on the pulse generator 258. The pulse generator 258 produces the P-1, P-2, and P-3 gate pulses in succesion as shown by the timing chart of FIG. 13E. The P-1 and P-2 gate pulses are used to step the pipelining of the machine. The P-3 gate pulse is used to test the output of the compare unit 266. The total count register 268 is initially set for the total number of minor cycles required.

A "minor" cycle can be considered to be a time required to produce a single train of three gate pulses, in other words, the time to produce a single train consisting of P-1 gate pulse, a P-2 gate pulse and a P-3 gate pulse. The total count register 268 is set to a number which is equal to the total number of "minor" cycles plus the number of cycles required to run the last data through the pipeline. The count up counter 264 is incremented each "minor" cycle by the P-1 gate pulse. When the content of the count up counter 264 is equal to that of the total count register 268, a pulse will be produced by the compare unit 266 which extends to the AND circuit 270 which is tested each "minor" cycle by the P-3 gate pulse. The pulse produced by the AND circuit 270 at this time extends to flip-flop device 256 to reset it to its 0 state thus turning off the pulse generator 258. The same pulse is also applied to gate 262 in order to test the event latch 260. If the latch 260 is still on its 0 state, a pulse will be produced on wire 272, which extends through OR circuit 248 to again turn "on" single shot device 250 in order to start a new major cycle. If the event latch 260 is in its 1 state, a pulse will appear on lead 274 to signal the end of separations. This timing chart of FIG. 13E will be understood better when the detailed circuits shown in the remaining figures are described.

Reference should next be made to FIGS. 14A and 14B (arranged as illustrated in FIG. 14) which show the detailed circuitry for the A, B, A IN and B IN memories. These are the memories shown on the right portion of FIG. 13A. These memories are grouped into five groups of four each. One group is shown in detail on FIG. 14A. Each memory has a capacity of 1024 words and each word is two bits long. In the beginning, before the logic simulation machine is started, all memories are loaded with initialized data.

The five operand addresses existing in the register 204 in FIG. 13A are fed to the five memory sections in FIG. 13A, and therefore five stored values are presented to register 210 in FIG. 13A each time a read-access is performed on the memories. Depending on the setting of the switch 276 at the left side of FIG. 14A, the memories A or A IN will be read or the memories B or B IN will be read. At this point, it is important to note that the A or A IN memories or the B or B IN memories are read as a single memory.

The lower order ten bits of the operand section of the processor instruction memory 204 are used to address both A and A IN or both B and B IN. The highest order bit (the eleventh bit of this operand section) is used to select either the normal or the IN sections. The important consideration at this point is that when these memories are read, the A and the A IN memories or the B and B IN memories are read as a single unit. This is not true when the memories are written into as will be described later. When these just mentioned memories are written into, they are addressed separately by the address counter 214 (shown at the upper left of FIG. 14A) which has only ten bits. The switches represented by the reference character 212 on FIG. 13A, are shown in FIG. 14A by the gates 278, 280, 282, and 264. These gates are controlled by the switch 276. If switch 276 is in its "0" position, the gates 278 and 284 will be enabled thus permitting the memories A and A IN to be read from or the memories B and B IN be written into.

The read and write pulses are applied to the memories on FIG. 14A by the P-1 pulse through gate 286.

Reference should next be made to FIG. 15 which shows the A and A IN memories for the control processor 32. These memories are similar to those in the other processors except that they are used in a much simpler manner. Information is always read out of the A memory and always written into the A IN memory. Reading and writing of the memory is done by the P-1 pulse which is applied to the gate 288.

Reference should next be made to FIGS. 16A and 16B, arranged as shown in FIG. 16, which show details of the inter-processor switch which is indicated in FIG. 1 and by the dotted lines on the left side of FIGS. 13C and 13D. The inter-processor switch has its own address counter 290 which supplies addresses to the switch memory 294 by the P-1 gate pulse and later transferred to register 296 by the P-2 gate pulse. There are thirty-two sections of the five bits each in register 296 and each one of these sections is decoded into one of thirty-two leads. The groups of leads from each one of these decoders is applied to gates such as 298, 300, 302 and 304. These gates are pulsed each "minor" cycle by the P-1 gate pulse. In this manner, pulses appear on cables such as 306, 308, 310, and 312 to enable gates such as 314, 316 through 318 and 320. An examination of the cables and the gates on FIG. 16B will indicate that data coming from any processor can be gated to itself or to any other processor by the P-1 gate pulse. It is believed that the operation of the inter-processor switch may now be understood by one skilled in the art and that no further explanation is needed for FIGS. 16A and 16B.

Reference should next be made to FIGS. 17A and 17B, arranged as illustrated in FIG. 17. FIG. 17A shows how the information in the register 216, which is also shown on FIG. 13A, refers to the logic unit for step one and how the control bits are directed to gates which suitably control the logic. From FIG. 17A, the results of the logic unit first step are passed along with certain of the control bits in register 216 (FIG. 13A) to the logic unit second step shown in FIG. 17B. The boolean logic equations for the logic unit second step are shown in FIG. 17 and it is believed that there will be no difficulty in understanding the operation of this unit.

The logic unit first step shown in FIG. 17A carries out specific logic functions. The inputs to logic unit first step accepts $X_1, X_1', X_2, X_2', \ldots, X_6, X_6'$ and $m_0^0, m_0^1, m_0^2, \ldots, m_0^{31}$ and $m_1^0, m_1^1, m_1^2, \ldots, m_1^{31}$ as shown in FIG. 17A. Using conventional logic circuits such as AND gates, OR gates and inverters arranged in a manner well known to those skilled in the art, the following logic operations are performed by the logic unit first step.

$a = X_1 + X_1'$,
$a' = \bar{X}_1 + X_1'$,
$b = X_2 + X_2'$,
$b' = \bar{X}_2 + X_2'$,
$c = X_3 + X_3'$,
$C = \bar{X}_3 + X_3'$,
$d = X_4 + X_4'$,
$d' = \bar{X}_4 + X_4'$, $e = X_5 + X_5'$, and
$e' = \bar{X}_5 + X_5'$.

Using the a, a', b, b', ..., e' so produced, the logic performs the following operations:

$FP_{32} = abcde$,
$FP_1 = acde'$,
$FP_2 = abcd'e$,
$FP_4 = abcd'e'$,
$FP_5 = abc'de'$,
$FP_6 = abc'd'e$,
$FP_7 = abc'd'e'$,
$FP_8 = ab'cde$,
$FP_9 = ab'cde'$,
$FP_{10} = ab'cd'e$,
$FP_{11} = ab'cd'e'$,
$FP_{12} = ab'c'de$,
$FP_{13} = ab'c'de'$,
$FP_{14} = ab'c'd'e$,
$FP_{15} = ab'c'd'e'$,
$FP_{16} = a'bcde$,
$FP_{17} = a'bcde'$,
$FP_{18} = a'bcd'e$,
$FP_{19} = a'bcd'e'$,
$FP_{20} = a'bc'de$,
$FP_{21} = a'bc'de'$,
$FP_{22} = a'b'c'd'e$,
$FP_{23} = a'bc'd'e'$,
$FP_{24} = a'b'cde$,
$FP_{25} = a'b'cde'$,
$FP_{26} = a'b'cd'e$,
$FP_{27} = a'b'cd'e'$,
$FP_{28} = a'b'c'de$,
$FP_{29} = a'b'c'de'$,
$FP_{30} = a'b'c'd'e$,
$FP_{31} = a'b'c'd'e'$.

Using the FP values thus generated and the $m_0^{32}, m_0^0, \ldots, m_0^{31}$ inputs, the following steps are carried out:

$GB_{32} = (\bar{m}_0^{32})(FP_0)$,
$GB_1 = (\bar{m}_0^1)(FP_1)$,
$GB_2 = (\bar{m}_0^2)(FP_2)$,
$GB_3 = (\bar{m}_0^3)(FP_3)$,
$BG_4 = (\bar{m}_0^4)(FP_4)$,
$GB_5 = (\bar{m}_0^5)(FP_5)$,
$GB_6 = (\bar{m}_0^6)(FP_6)$,
$GB_7 = (\bar{m}_0^7)(FP_7)$,
$GB_8 = (\bar{m}_0^8)(FP_8)$,
$GB_9 = (\bar{m}_0^9)(FP_9)$,
$GB_{10} = (\bar{m}_0^{10})(FP_{10})$,
$GB_{11} = (\bar{m}_0^{11})(FP_{11})$,
$GB_{12} = (\bar{m}_0^{12})(FP_{12})$,
$GB_{13} = (\bar{m}_0^{13})(FP_{13})$,
$GB_{14} = (\bar{m}_0^{14})(FP_{14})$,
$GB_{15} = (\bar{m}_0^{15})(FP_{15})$,
$GB_{16} = (\bar{m}_0^{16})(FP_{16})$,
$GB_{17} = (\bar{m}_0^{17})(FP_{17})$,
$GB_{18} = (\bar{m}_0^{18})(FP_{18})$,
$GB_{19} = (\bar{m}_0^{19})(FP_{19})$,
$GB_{20} = (\bar{m}_0^{20})(FP_{20})$,
$GB_{21} = (\bar{m}_0^{21})(FP_{21})$,
$GB_{22} = (\bar{m}_0^{22})(FP_{22})$,
$GB_{23} = (\bar{m}_0^{23})(FP_{23})$,
$GB_{24} = (\bar{m}_0^{24})(FP_{24})$,
$GB_{25} = (\bar{m}_0^{25})(FP_{25})$,
$GB_{26} = (\bar{m}_0^{26})(FP_{26})$,
$GB_{27} = (\bar{m}_0^{27})(FP_{27})$,
$GB_{28} = (\bar{m}_0^{28})(FP_{28})$,
$GB_{29} = (\bar{m}_0^{29})(FP_{29})$,
$GB_{30} = (\bar{m}_0^{30})(FP_{30})$,
$GB_{31} = (\bar{m}_0^{31})(FP_{31})$,
$GC_{32} = (\bar{m}_1^{32})(FP_0)$,
$GC_1 = (\bar{m}_0^1)(FP_1)$,
$GC_{30} = (\bar{m}_0^{30})(FP_{30})$,
$GC_{31} = (\bar{m}_0^{31})(FP_{31})$,
$GD_{32} = (\bar{m}_1^{32})(FP_0)$,
$GD_1 = (\bar{m}_1^1)(FP_1)$,
$GD_{30} = (\bar{m}_1^{30})(FP_{30})$,
$GD_{31} = (\bar{m}_1^{31})(FP_{31})$,
$GE_0 = (\bar{m}_1^{32})(FP_0)$,
$GE_1 = (\bar{m}_1^1)(FP_1)$,
$GE_{30} = (\bar{m}_1^{30})(FP_{30})$, and
$GE_{31} = (\bar{m}_1^{31})(FP_{31})$.

Using the above values:
$GF = GB_{32} + GB_1 + \ldots + GB_{30} + GB_{31}$,
$GG = GC_{32} + GC_1 + \ldots + GC_{30} + GC_{31}$,
$GH = GD_{32} + GD_1 + \ldots + GD_{30} + GD_{31}$, and
$GI = GE_{32} + GE_1 + \ldots + GE_{31} + GE_{31}$.

Reference is made to FIG. 18 which shows the details of the event logic of FIG. 13C. The event logic is shown on FIG. 13C with one of its inputs coming from the mask field in register 240 and its input from the cable 244 which comes from the interprocessor switch. As shown on FIG. 18, the data from the mask field in register 240 combines with the data from the inter-processor switch to produce an output of the or circuit 322 which provides an output on line 324 in order to set the event latch 260 to its 1 state. In that case, it is said that an "event" has occured. As mentioned before, the detection of an "event" causes a signal to appear on lead wire 274 on FIG. 13D which signals the end of operations.

In other words, no more major cycles are needed. The results of the operations which now exist in the A, B, A IN or B IN memories in processors 1 through 31 and in the A IN memory in processor 32 can be analyzed in any suitable manner. Such analyzing of this data in the machine is done by the host computer in conjunction with the lead computer which acts as an interface between the host computer and the logic simulation machine.

Although the logic simulation machine of the Cocke et al. patent as described above is capable of accurately simulating a wide variety of predetermined logic functions, nevertheless, that machine suffers from a drawback in that the machine imposes a predetermined fixed unit delay for each logic function simulated. This fixed unit delay is the same for both rising (low-to-high) and falling (high-to-low) signal transitions.

Accordingly, it is the primary object of the present invention to provide an improvement of the above-described logic simulation machine in which variable delays are permitted for the various logic functions being simulated.

Also, it is an object of the present invention to provide an improved logic simulation machine in which, in addition to the variable delays, the delays can be made different for rising and falling signal transitions.

Yet further, it is an object of the present invention to provide such an improved logic simulation machine in which the above-described major cycles are eliminated and the machine is operated on an event-driven basis. That is, a cycle of the machine is performed only when a signal transition occurs, rather than at fixed intervals of time.

SUMMARY OF THE INVENTION

In accordance with these and other objects of the invention, there is provided a logic simulation machine composed of a plurality of basic processors, a control processor and an inter-processor switch interconnecting the basic processor and the control processor. The basic processors, as in the case of the Cocke et al. patent, determine a value of a simulated logic function output as a proposed output of a fixed constant delay for the logic function being simulated. In accordance with the invention, the proposed output for each simulated logic function is delayed from a final output for a delay time specific to the logic function being simulated. The delay time is specifically chosen in accordance with whether the output of the simulated logic function is to undergo a low-to-high or high-to-low transition.

Further, there is provided means for detecting the presence of glitches in the proposed output which have a duration less than the corresponding delay time, that is, the low-to-high or high-to-low delay time, of the logic function being simulated. Such glitches are inhibited in the final output of the simulated logic function. As used herein, the term "glitch" means an undesirable output of short duration of a logic function caused by changes of state in two or more input signals to the function in rapid succession. For instance, for a two-input NAND gate, if one input signal undergoes a zero-to-one transition shortly after the other input signal has undergone one-to-zero transition, an output signal will be generated in the zero state for a short duration. However, to accurately simulate a logic function, such a glitch in the simulated output of the simulated logic function should be inhibited if the corresponding delay time of the logic function, that is, the delayed time of the appropriate one of low-to-high and high-to-low transition, is longer than the duration of the glitch.

Further in accordance with the invention, the basic processors simulate the various logic functions in successive work cycles of logic operation. However, unlike the logic simulation machine of Cocke et al., the work cycles utilized by the basic processors of the present invention do not correspond to a fixed time period. Instead, with the invention, the use of a variable length work cycle permits the processors to advance rapidly in time sequence, in many instances, through the equivalent of many major cycles of the logic simulation machine of Cocke et al. Specifically, to determine the time through which the basic processors are all simultaneously advanced through the logic operations being simulated in each work cycle, each basic processor determines a minimum time to a next successive logic operation for each logic function being simulated. The minimum values thus determined for each basic processor are examined to determine a global minimum work space value among all of the basic processors. This global minimum work space value relates to the amount of time in the simulation of the logic operation through which all of the basic processors and the control processor are simultaneously advanced.

Yet more specifically, the time to a next successive logic operation for each logic function simulated is determined at the beginning of the simulation of a particular logic operation by the value of a delay time, that is, a low-to-high or high-to-low delay time as appropriate, for the logic function being simulated. For successive work cycles until the proposed transition in the simulated logic function is to be propagated, that is, from the time that the portion of the basic processor disclosed in the Cocke et al. patent computes a new value of a simulated logic function until the processor of the present invention propagates that value as a final output value, the global minimum work space is subtracted from the delay time value once for each work cycle using a negative accumulation technique. That is, for a first work cycle following an initial cycle, the global minimum work space value is subtracted from the delay time itself and the difference therebetween stored. For the next successive work cycle, the new global minimum work space value for that work cycle is subtracted from the difference previously stored. This process is continued until the proposed transition in the simulated output is propagated as a final simulated output.

Further in accordance with the invention, the presence of a glitch in a proposed output is detected by comparing a proposed output (as calculated by the basic processor of the Cocke et al. patent) in a present work cycle with that of the previous work cycle. If these are different, and if the basic processor has determined that a change which is due to be propagated in the proposed output signal has occurred but it has not yet been propagated due to the delayed time of the simulated logic function, the presence of a glitch is affirmatively detected. The detected glitches are inhibited from the final output of the basic processor.

To compute the minimum work space value for each basic processor, each basic processor for each minor cycle compares the subtraction output with the value stored in a latch. The latch is initialized to a maximum value at the beginning of each work cycle. If the subtraction result is less than the value stored in the latch, the content of the latch is replaced with the subtraction output. This occurs for each logic function being simulated, that is, for each minor cycle of a work cycle. Thus, at the end of the work cycle, the value stored in the latch is the minimum work space value for that basic processor.

To determine a global work space value, a counter is initialized to zero and then incremented in single steps. The output of the counter is compared with the value stored in all of the latches of all of the basic processors. When the counter value first becomes equal to the content of the latch in one of the basic processors, that value is retained as the global minimum work space value. One such counter can be provided for each basic processor, or if desired, one such counter can be provided for the entire logic simulation machine.

BRIEF DESCRIPTION OF THE DRAWINGS

FIG. 2 is an illustration of a schematic block diagram of a logic circuit used in explaining the operation of processors shown in FIG. 1.

FIGS. 3 and 4 are tables used in the explanation of the logic circuit shown in FIG. 2.

FIG. 5 is an illustration of a schematic block diagram of a portion of the structure of a logic unit employed in the processors of the logic simulation machine of FIG. 1.

FIG. 6 is a table used in the explanation of the structure of FIG. 5.

FIG. 7 is an illustration of a schematic block diagram of a further portion of the logic unit of the processors of the logic simulation machine of FIG. 1 used for performing "dotted" or wired logic.

FIG. 8 is an illustration of a schematic block diagram of a specific 3-way collector circuit used in the explanation of the processors of the logic simulation machine of FIG. 1.

FIG. 9 is a table used in the explanation of the operation of the circuit of FIG. 8.

FIGS. 13A through 13E, arranged as shown in FIG. 13 illustrate a more detailed schematic diagram of the logic simulation machine of FIG. 1.

FIGS. 14A and 14B arranged as shown in FIG. 14 illustrate a detailed schematic diagram of memory circuits of FIG. 13A.

FIGS. 16A and 16B arranged as shown in FIG. 16 illustrate a more detailed schematic diagram of the inter-processor switch of the logic simulation machine.

FIG. 23 is a logic diagram of a circuit utilized in the improvements of FIGS. 22A and 22B.

FIGS. 25A and 25B are tables showing the states of various signals in the improved basic processor for an example discussed below.

DESCRIPTION OF THE PREFERRED EMBODIMENTS

Figure 1:
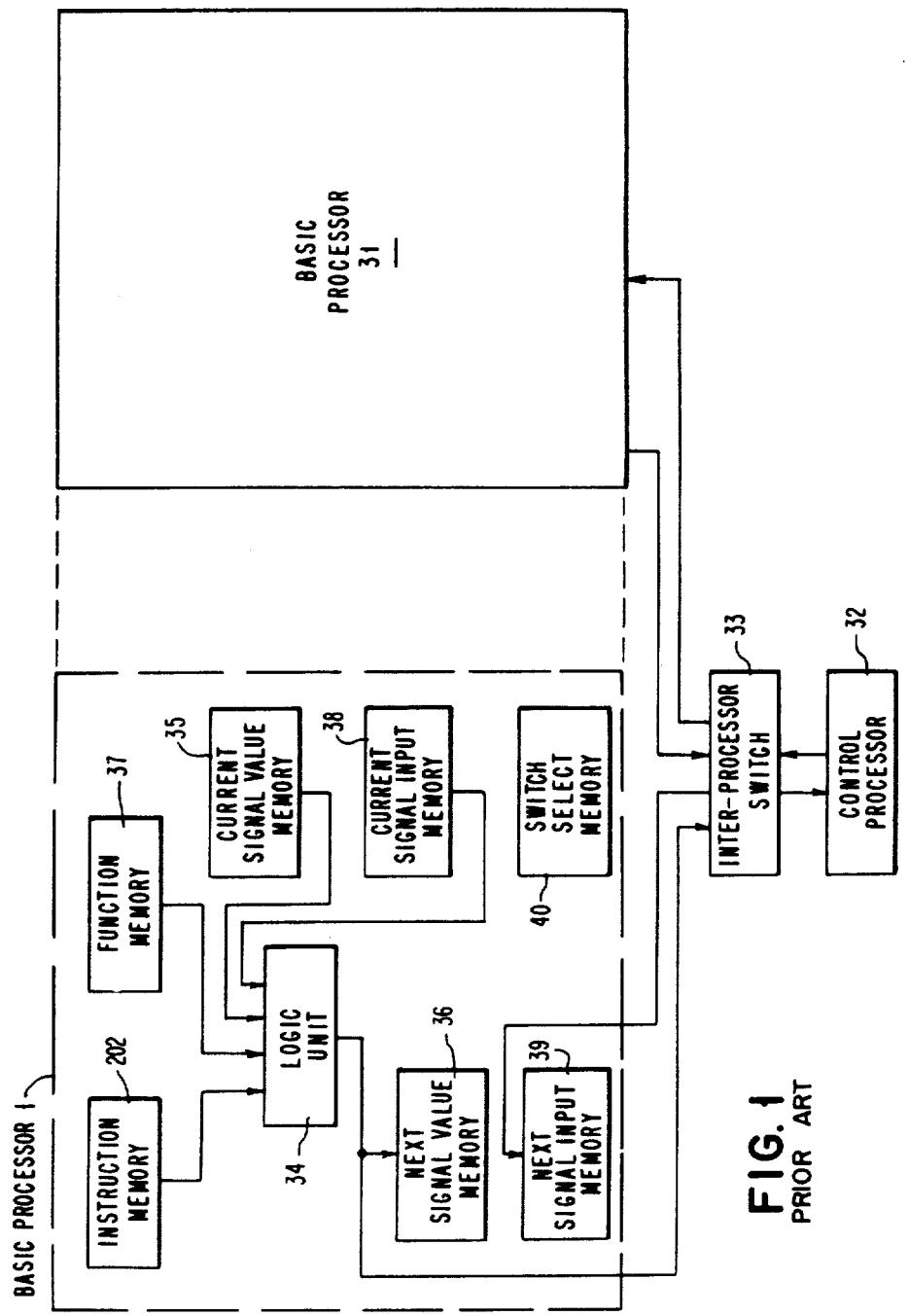
FIG. 1 is an illustration of a schematic block diagram of one embodiment of a prior art logic simulation machine of which the present invention is an improvement.
Figures 10, 11, 12:
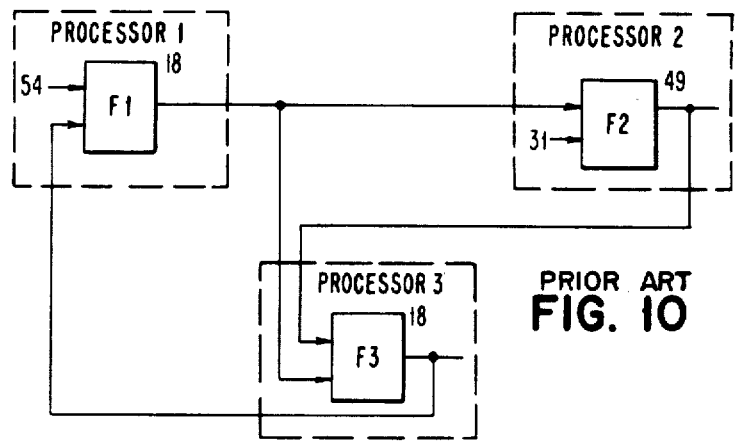
FIG. 10 is an illustration of a schematic diagram of a portion of a processor of FIG. 1 for describing the operation of the communication between processors.
FIGS. 11 and 12 are tables used in the explanation of the structure of FIG. 10.

As discussed above, the present invention is an improvement in the logic simulation machine of the Cocke et al. patent described in detail above. As such, the discussion below centers upon the improvements contributed by the present invention. As used in the discussion below, like-named signals and like reference numerals indicate like or similar signals or components in common with the logic simulation machine described above.

Figure 19:
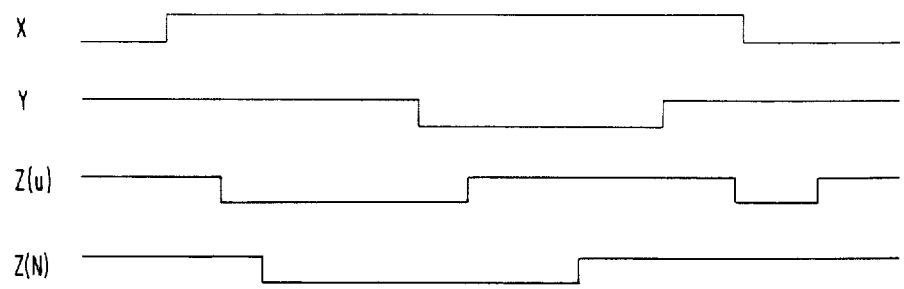
FIG. 19 is a timing waveform diagram used to illustrate an improvement in logic simulation provided by the present invention.

Referring first to the timing diagram of FIG. 19, an advantage of the improved logic simulation machine over that of Cocke et al. will be described. FIG. 19 shows the output of the logic simulation machines of Cocke et al. and of the invention for the simulation of a single NAND gate over a number of cycles. The signals X and Y are applied as inputs to the NAND gate and Z is the output of NAND gate. The unit delay simulator of Cocke et al., due to its inability to simulate non-unit delays, computes Z(U) as the output. That is, because signals X and Y are both in the logic 1 state for a single unit of time (corresponding to one major cycle in the earlier logic simulation machine), a glitch in the 0 state is propagated around cycle 13.

To be able in actuality to propagate such a glitch, the NAND gate must have a delay time which is equal to or less than the pulse width of the glitch. If, on the other hand, the delay time of the NAND gate is greater, it is desirable that the logic simulation machine produce a simulated output from the NAND gate which does not include such a glitch.

The desired output is shown as Z(N) wherein the glitch has been removed. Here, it is assumed that the delay time for falling transitions for the NAND gate being simulated is equal to the time for two major cycles and that the delay time for rising transitions is equal to the time for three major cycles. The output signal Z(N) shown in FIG. 19 also takes this into account. Thus, it can readily seen that the signal Z(N) is a more accurate simulation of NAND gate than is produced by the above-described logic simulation processor. The logic simulation processor of the present invention in fact will produce the output Z(N).

Referring now to the block/logic diagram of FIGS. 22A and 22B, the improvements contributed by the invention to the basic processors 1-31 of Cocke et al. will now be discussed. (FIGS. 22A and 22B may, for convenience, be placed side by side with FIG. 22A to the left.)

In accordance with the invention, the number of switches 212 is expanded as is the capacity of the A, A IN, B and B IN memories. The basic operation and addressing of the switches 212 and the memories is the same as described above, only the capacities thereof have been expanded and the content of the expanded portions is different than above.

The output of the expanded portions of the A and B memories is applied as inputs of a latch 350. The latch 350 stores values $O_D(n)$, $S_D(n)$, $S_S(n)$ and WS(n). $O_D(n)$ represents the current (current being indicated by the index "n") value of the "old" data, that is, the output from the logic unit from the previous work cycle. (As used hereinafter in this context, "logic unit" refers to the basic processor described above and in the Cocke et al. patent.) $S_D(n)$ is termed the "saved" data signal. This signal is utilized to indicate the changed state of a simulated logic output signal which is to undergo a transition, as indicated by the input signal LU IN to the circuit, but which has not been propagated as of yet. It may, for instance, represent an input signal which has been applied to a simulated NAND gate which would change the output of the NAND gate but the change has not yet reached the output of the NAND gate because of the delay time of the gate. This signal will be saved in the improved portion of the processor as the signal $S_D(n)$ and propagated only after the designated delay time of the NAND gate. The signal $S_S(n)$ is a status bit. $S_S(n)$ is set in the 1 state to indicate that $S_D(n)$ is unequal to $O_D(n)$, that is, to indicate that a transition in an output signal has been calculated but has not yet been propagated as an output signal due to a simulated delay. WS(n) is multi-bit value indicating the length of a "work space". The work space length is defined as the time from the present cycle until a proposed change in the output signal from the processor can take place. For reasons which will become clear below, WS(n) has meaning only if $S_S(n)=1$.

Further in accordance with the invention, the instruction memory 202 is also expanded. Specifically, the the instruction memory 202 is expanded to include delay time values for both low-to-high (LH) and high-to-low (HL) transitions for each device being simulated.

Discussed below is the simulation of the circuit shown in FIG. 2 with different low-to-high and high-to-low delay times for each of the NAND gates shown in FIG. 2. Each NAND gate in FIG. 2 has been labeled with exemplary LH and HL delay times. FIG. 21 is an expansion of the table of FIG. 3, expanded to include the delay time of the various NAND gates of FIG. 2 as an example to illustrate how the LH and HL values are to be stored in the instruction memory 202. It is to be noted that the actual values stored in the instruction memory 202 are one unit less than the actual delay of the device simulated. The reason for this is that a delay of one unit is the minimum permitted with the logic simulation machine of the present invention, and that that one unit delay is accounted for in the logic unit of the Cocke et al. basic processor.

Returning now to FIGS. 22A and 22B, the output from the expanded portion of the instruction memory 202 is read out into a latch 351. The signal WS(n) is fed to two input ports of the multiplexer 351 and the values LH and HL are connected to two other respective input ports thereof. The signal which passes through the multiplexer 351 is determined by the state of the signals $S_D(n)$ and $S_S(n)$ stored in the latch 350. When the signal $S_S(n)$ is in the 1 state, regardless of the state of the signal $S_D(n)$, the output of the multiplexer will be WS(n). On the other hand, when the signal $S_S(n)$ is the 0 state, one of the LH and HL values (stored in a latch 351) will be passed through the multiplexer 352, that one being determined by the state of the saved data signal $S_D(n)$. If $S_D(n)$ is in the 0 state, indicating that a transition from low-to-high is to take place, the LH value is passed through the multiplexer 352. Otherwise, when $S_D(n)$ is in the 1 state (indicative of a transition from high-to-low) the value HL is passed through the multiplexer 351.

The output of the logic unit LU IN is coupled to one input of a multiplexer 369 which, in accordance with the invention, has been interposed at the input of the logic unit output register 226 of FIG. 13B.

The old data signal $O_D(n)$ is applied to the other input of the multiplexer 369. A new cycle status signal $S_S(n+1)$ is applied as the control input of the multiplexer 369. If the logic unit output signal LU IN is indeed correct, specifically, if there are no changes to be made in that signal due to a non-unitary logic delay or the presence of a glitch, the LU IN signal is propagated through the multiplexer 369 and the logic unit output register 226. Otherwise, $O_D(n)$ is applied thereto through the multiplexer 369. For instance, if the logic unit has determined that the output of a NAND gate is to change from 1 to 0, but the improved portion of the processor shown in FIGS. 22A and 22B has determined that because of a non-unitary delay of a gate that the new output signal is not yet to be propagated, an output signal of $O_D(n)=1$ is outputted through the multiplexer 369. (The generation of the $S_S(n+1)$ signal will be discussed below.)

At the beginning of each work cycle (which differs from the "major cycle" of the machine of Cocke et al. in ways which will become clear below), a DR (decrement register) counter 374 is preset with a value which represents the minimum work space value among all of the basic processors 1-31 in the system. The output of the DR counter 374 is passed through a non-zero circuit 372 (shown in detail in FIG. 23) which ensures that the output value from the DR counter 374 is never all zeroes nor all ones. The output of the non-zero circuit 372 DR IN is stored in a DR register 366.

If the status bit signal $S_S(n)$ is in the 1 state, the content of the DR register 366 is subtracted from the output of the multiplexer 352. It will be recalled that when the $S_S(n)$ signal is in the 1 state, the output of the multiplexer 352 is the signal WS(n).

To perform the subtraction, the output from the DR register 366 is inverted by an inverter array 367 and then passed through an AND gate array 368 and applied to one input port of an adder 361. Specifically, each output line from the inverter array 367 is applied to first inputs of each AND gate of the AND gate array 368, while the signal $S_S(n)$ is applied in common to second inputs of each of the AND gates of the array 368. Thus when $S_S(n)=1$, the output of the AND gate array 368 is the complement of the value stored in the DR register 366. If $S_S(n)=0$, zeros will applied to the second inputs of the AND gates of the array 368 so that the output therefrom applied to the adder 361 is all zeroes. This of course corresponds to the case where one of LH or HL is passed through the multiplexer 352, that is, in an initial condition or at the beginning of a delay time. Because, in that case, all zeroes are applied from the AND gate array 368 and the carry in bit $C_{IN}$ (supplied to $S_S(n)$) to the adder is zero, WS(n) is passed directly through the adder 361.

While WS(n) and the inverted output from the DR register 366 are applied to respective input ports of the adder 361 and $S_S(n)=1$ is applied as the carryin input $C_{IN}$ of the adder 361, a two's complement subtration is performed. The output from the adder 361 resynchronized through latches 362-1 through 362-3 forms the work space signal WS(n+1) for the next work cycle. This is coupled back into the appropriate one of the A and B memories as determined by the state of the switch 212.

An OR gate 363 has inputs coupled to the various output bits of the latch 362-3. Thus, the output WSO of the OR gate 363 is a 1 when the length of the work space for the next work cycle is nonzero and a 0 when the contrary is true.

The EXCLUSIVE-OR gate 357 is provided to detect the presence of transitions in the calculated output in moving from a previous work cycle n−1 to a present work cycle n. This is done by performing an exclusive-or operation between the logic unit output signal LU IN and the saved data signal $S_D(n)$ resynchronized through latches 353-1 through 353-4. The output of the EXCLUSIVE-OR gate 357 will thus be in the 1 state if and only if the value of LU IN is different from the resynchronized $S_D(n)$ signal.

The NAND gate 358 is provided to detect the presence of glitches. As mentioned above, glitches are to be suppressed, that is, not propagated as an output signal from the processor, if the width of the glitch is less than the delay time of the device being simulated (more specifically, the indicated one of the low-to-high and high-to-low delay times). A glitch of this nature will be detected if the output of EXCLUSIVE-OR gate 357 is $O_D(n)$ and the resynchonized value of $S_S(n)$ at the output of the latch 353-4 is also 1. (It is to be noted that the presence of a glitch is indicated by a 0 on the output $\overline{GD}$ of the NAND gate 358. This is done only as a matter of convenience for other portions of the circuitry.)

The OR gate 359 performs an OR operation between the output of the EXCLUSIVE-OR gate 357 and the resynchronized value of $S_S(n)$. The purpose of providing the OR gate 359 is to generate a signal SO which will cause the work space value WS(n+1) for the next work cycle to be decremented. This will occur either when $S_S(n)=1$ or the output of EXCLUSIVE-OR gate 357 is a 1, that is when a change in the simulated output is detected either in the current cycle (n) or in the previous cycle (n−1).

To generate the new status signal $S_S(n+1)$ for the next work cycle, the output from the OR gate 363, the output from the OR gate 359 and the output from the NAND gate 358 are applied to corresponding inputs of an AND gate 364. The output signal from the AND gate 364 (the signal $S_S(n+1)$) is thus in the 1 state when: (1) the output from the OR gate 363 is a 1 indicating a non-zero work space length for the next work cycle, (2) either the current status bit $S_S(n)$ is 1 or the EXCLUSIVE-OR gate 357 has detected a transition will occur in the next work cycle, and (3) there is no glitch. The output $S_S(n+1)$ from the AND gate 364 is utilized to control the multiplexer 359, as described above.

The signals $S_S(n+1)$ (from the output of AND gate 364), $S_D(n+1)$ (which is identical to LU), and $O_D(n+1)$ (from the output of the multiplexer 369) are fed back through the switch 212 to the currently selected one of the A and B memories along with the new work space signal WS(n+1).

Figures 21, 22B:
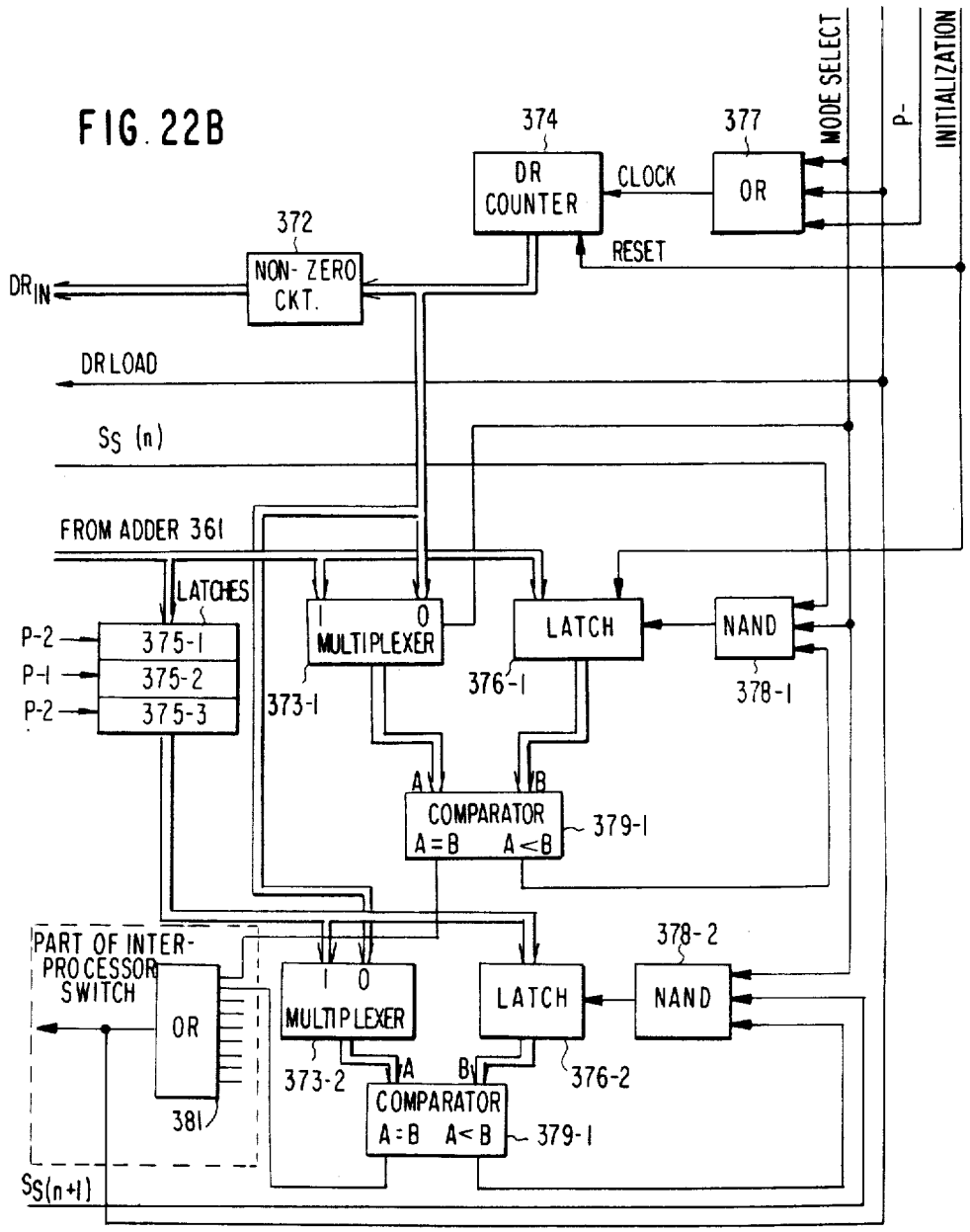
FIG. 21 is a table used in the explanation of the logic circuit of the improved logic simulation machine of the invention.
FIGS. 22A and 22B, taken together, are a block-/logic diagram of improvements added to the basic processors of the logic simulation machine of the Cocke et al. patent described above.

With reference to that portion of the circuitry shown specifically in FIG. 22B, the output of the adder 361 is also coupled to circuit elements utilized to determine a minimum work space value for this particular basic processor, and ultimately a global minimum work space value for the overall logic simulation machine which is loaded into all of the DR counters 374 of all of the basic processors 1 through 31 in the system. As mentioned above, at the beginning of a work cycle, the DR counter 374 is loaded with the minimum work space value from among all of processors 1 through 31. The determination of which of the processors 1 through 31 has the minimum work space for the next work cycle is performed by circuitry including multiplexers 373-1 and 373-2, latches 376-1 and 376-2, comparators 379-1 and 379-2 and NAND gates 378-1 and 378-2 (in each basic processor 1 through 31) and an OR gate 381 (which is part of the inter-processor switch 33). If desired, the function of the OR gate 381 can be implemented with a wired-OR connection.

The "−1" components perform this function for the present cycle n and the "−2" components for the next cycle n+1. As the operation of the two is the same (except that the adder output is resynchronized with latches 375-1 through 375-3 in the latter case), the "-1" and "-2" designations have been omitted below.

More specifically, the output from the adder 361 is applied to a first input port of a multiplexer 373 and to the input of the latch 376. During the first phase (termed Phase I) of a work cycle, the signal MODE SELECT is in the 1 state so that the multiplexer 373 is configured to pass the output from the adder 361 to one input port of the comparator 379. The latch 376 is initially set to all 1's by a signal labelled INITIALIZATION supplied from the host processor. Thus, during Phase I of each work cycle, the output from the adder 361 is continuously compared with the value stored in the latch 376. If the output from the adder 361 is less than the value stored in the latch 376, the "less than" output of the comparator 379 is in the 1 state, thereby enabling the latch 376 to store the then-present output value from the adder 361. (It may be noted that the latch 376 is enabled when the output from the NAND gate 376 is in the zero state.) If, on the other hand, the output from the adder 361 is greater than the value stored in the latch 376, the value then present in the latch 376 is retained. In this fashion, the value remaining in the latch 376 in any basic processor at the end of Phase I of the work cycle is the minimum work space value found during the work cycle for that processor.

Then, at the end of Phase I (the data computation portion of the work cycle), operations shift to Phase II where the MODE SELECT signal is set to the 0 state. In Phase II, the output from the DR counter 374 is coupled through the multiplexer 373 to the comparator 379. The DR counter 374 in each basic processor, which have all been reset to the all zeros state, are then incremented simultaneously in each of the basic processors 1–31. When the first DR counter 374 of any of the basic processors 1–31 reaches the value stored in its corresponding latch 376, the "=" output from the comparator 379 will be generated. The first basic processor to generate the "=" output will of course be the basic processor which has the minimum work space value among all of the basic processors.

The "=" outputs from the comparators 379 of all of the basic processors 1–31 are ORed together by the OR gate 381 (which may be a wired OR connection if desired) in the inter-processor switch 33. The output of the OR gate 381 (DR LOAD) is connected to all the basic processors 1 through 31 as one input to the OR gate 377. The presence of a 1 at the input of the OR gate 377 causes the DR counter 374 to stop counting and retain the count value then present. Also, the DR LOAD signal causes the loading of the output of the DR counter 374 into the DR register 366.

If desired, a single DR counter can be provided for the overall logic simulation machine. This can be done since, in the case of multiple DR counters, they all always have the same count value.

Figure 22A:
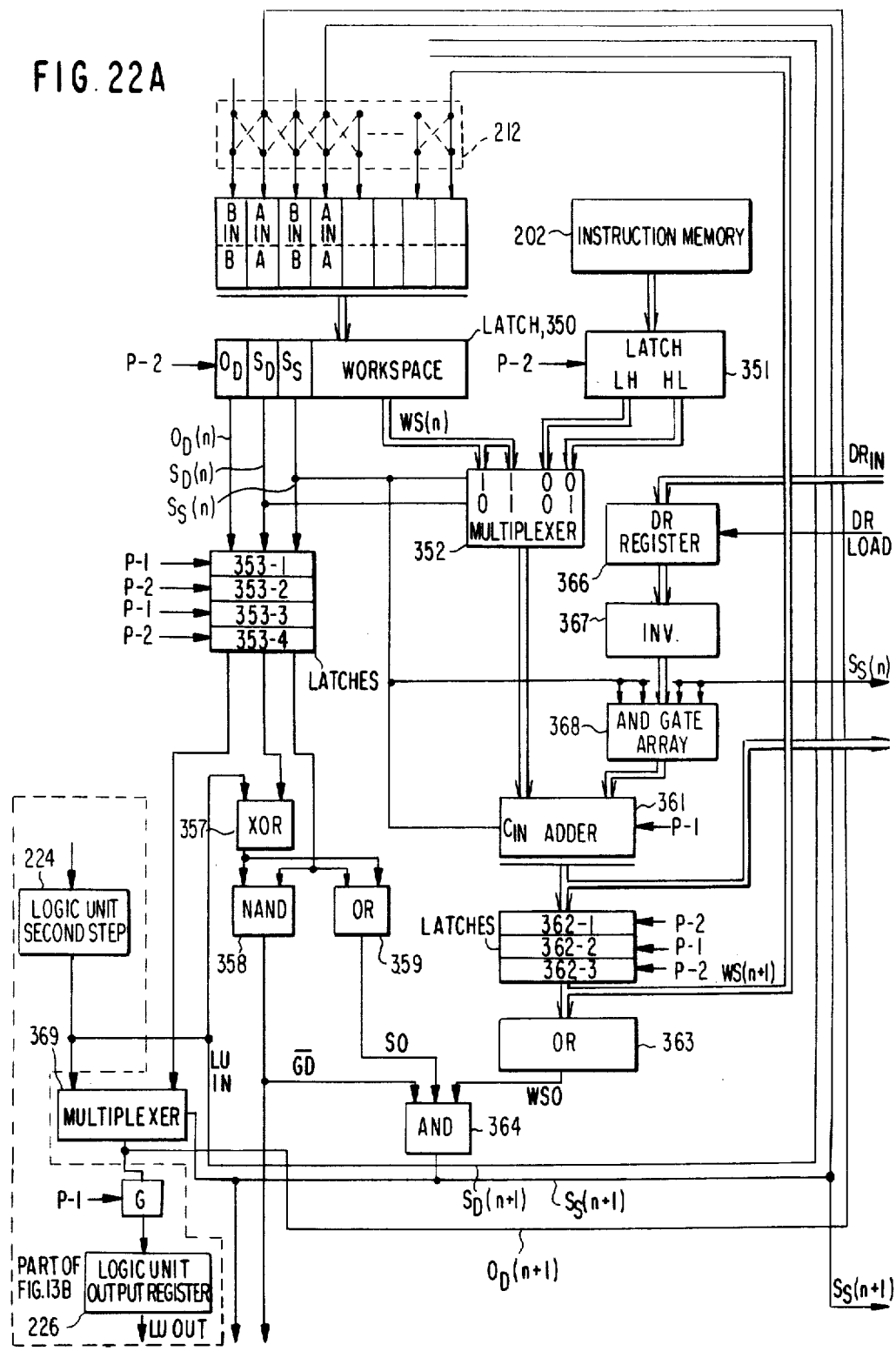

FIG. 23 shows the details of the non-zero circuit 372 utilized in the processor additions of FIGS. 22A and 22B. An OR gate 392 has inputs connected to each of the output lines from DR counter 374. An OR gate 391 is connected in series with the lowest-order output line. The output from the NOR gate 392 is coupled to a second input of the OR gate 391. If all of the output signals from the DR counter 374 are in the 0 state, the output of the NOR gate 392 will be a 1. This is applied through the OR gate 391 to the lowest order output line to thereby ensure that all of the output lines from the DR counter 374 cannot be in the 0 state.

The modifications to the control processor 32 of the Cocke et al. patent contributed by the present invention will now be discussed with reference to FIGS. 24A–24D.

Figure 13C:
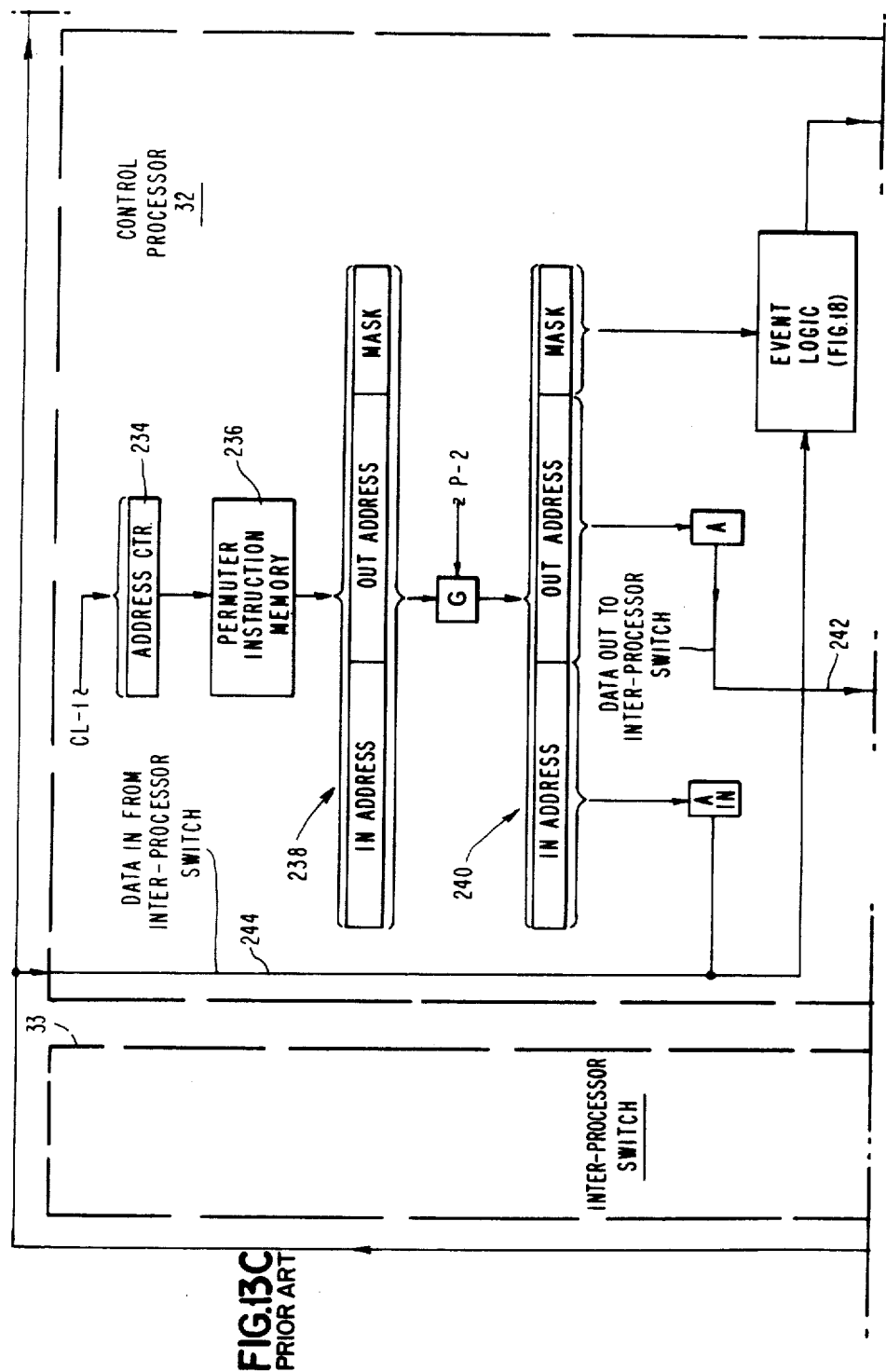
Figure 24A:
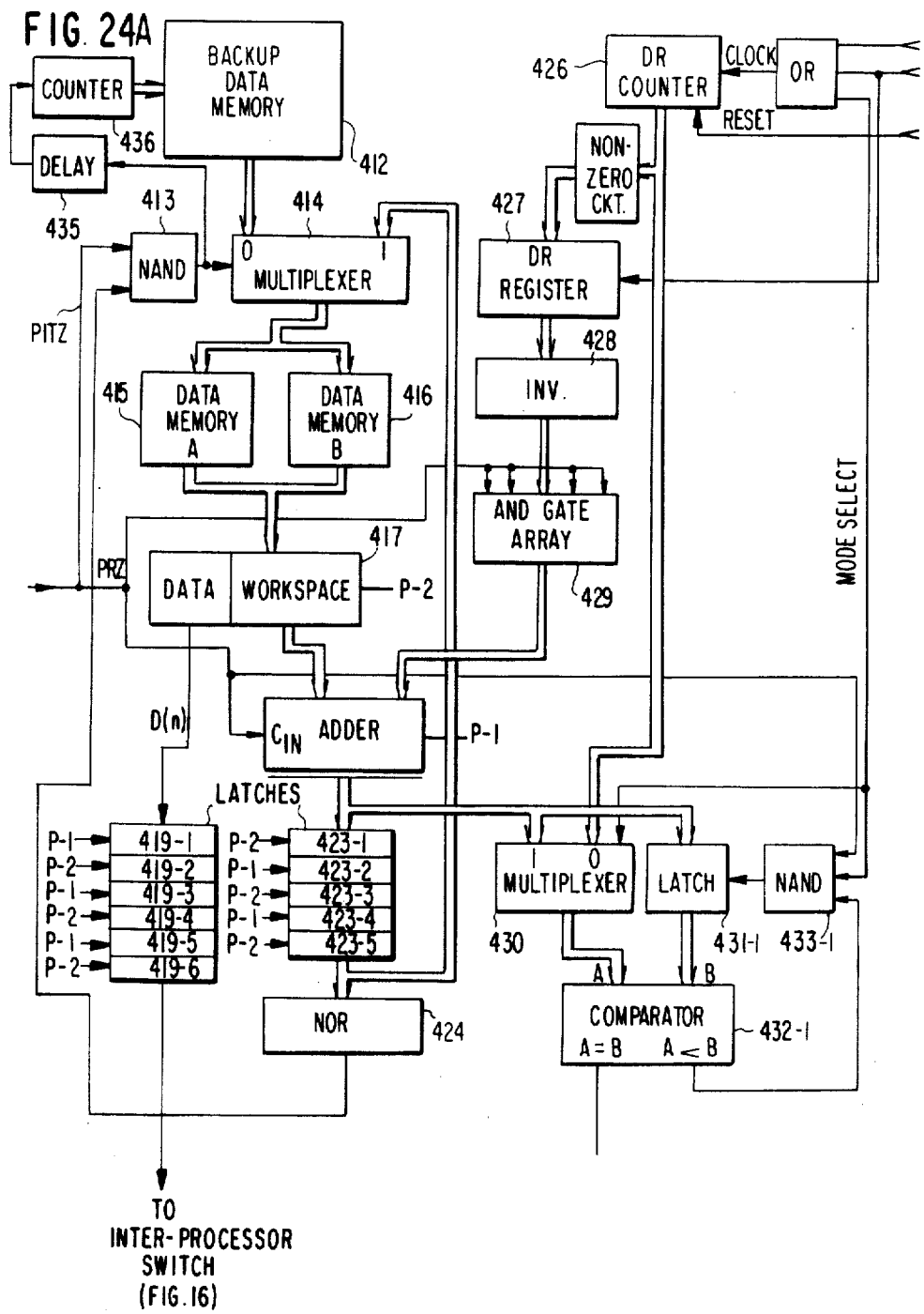
FIGS. 24A-24D are block/logic diagrams of improvements added to the control processor of the logic simulation machine of the Cocke et al. patent.
Figure 24B:
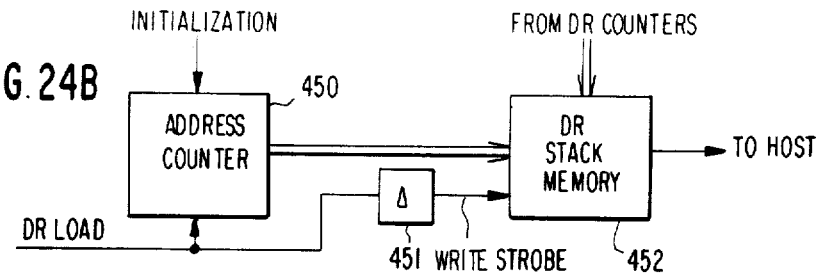
Figure 24C:
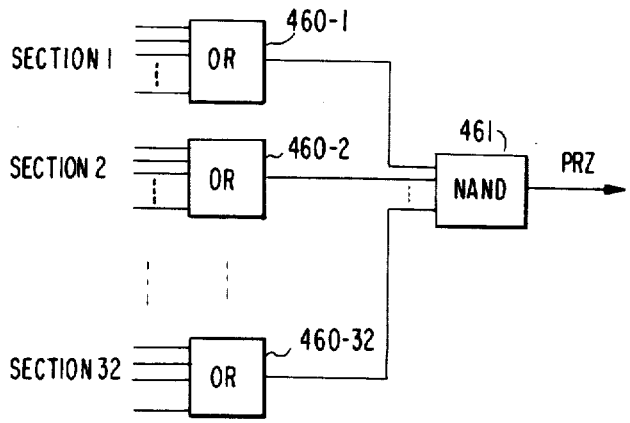
Figure 24D:
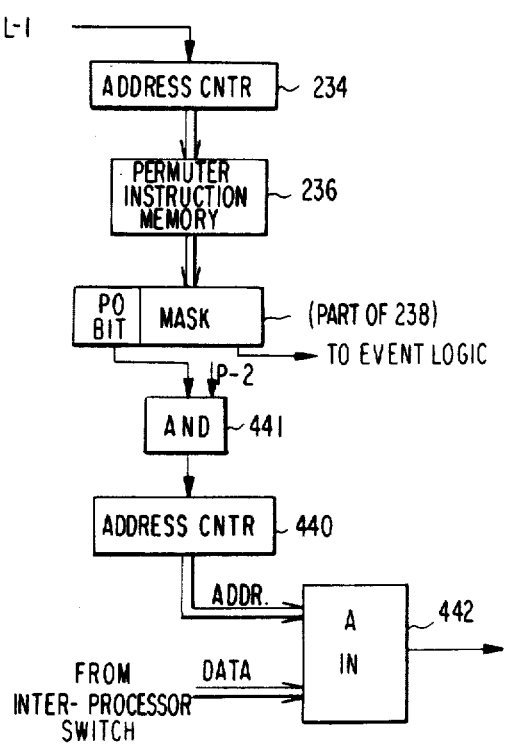

The "OUT ADDRESS" circuitry of FIG. 13C is replaced with the control processor circuitry shown in FIGS. 24A–24C while the "IN ADDRESS" circuitry of FIG. 13C is replaced with that shown in FIG. 24D.

First referring to FIG. 24A, the control processor circuitry shown therein is constructed much as one of the modified basic processors discussed above and shown in FIGS. 22A and 22B, although of course there is no calculation and propagation of actual simulated function outputs is in the basic processors 1 through 31. A backup data memory 412 stores primary input signals in the form shown in FIG. 27 for the example of primary input signals shown in FIG. 26.

Figures 26, 27:
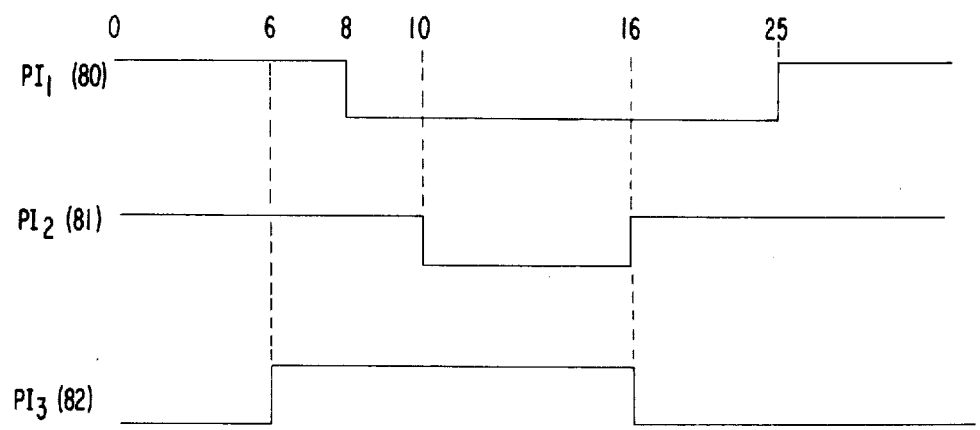
FIG. 26 is a timing diagram showing an example of primary input signals to a basic processor.
FIG. 27 is a table showing how the signals shown in FIG. 26 are encoded and stored.

The three primary input signals $PI_1$, $PI_2$ and $PI_3$ of FIG. 26 are identified by numbers 80, 81 and 82, respectively. The states of the primary input signals are stored, as shown in FIG. 27 in a "pop-up stack" of transitions. For instance, the top entry in the table indicates that 82 ($PI_3$) makes a transition to the 1 state and remains there for ten time units. The next entry in the table corresponds to the next transition in sequence, namely, the transition of 80 ($PI_1$) to the zero state where it remains for 17 time units. The entries "100+" indicate that the corresponding signal remains in the state shown for an indefinite period, that is, until the system has reached steady state.

The backup data memory 412 is addressed by an address counter 436, which is incremented once by each pulse produced on the output of a NAND gate 413 after passing through a delay circuit 435. The output of the NAND gate 413 also controls the switching state of a multiplexer 414.

Figure 16B:
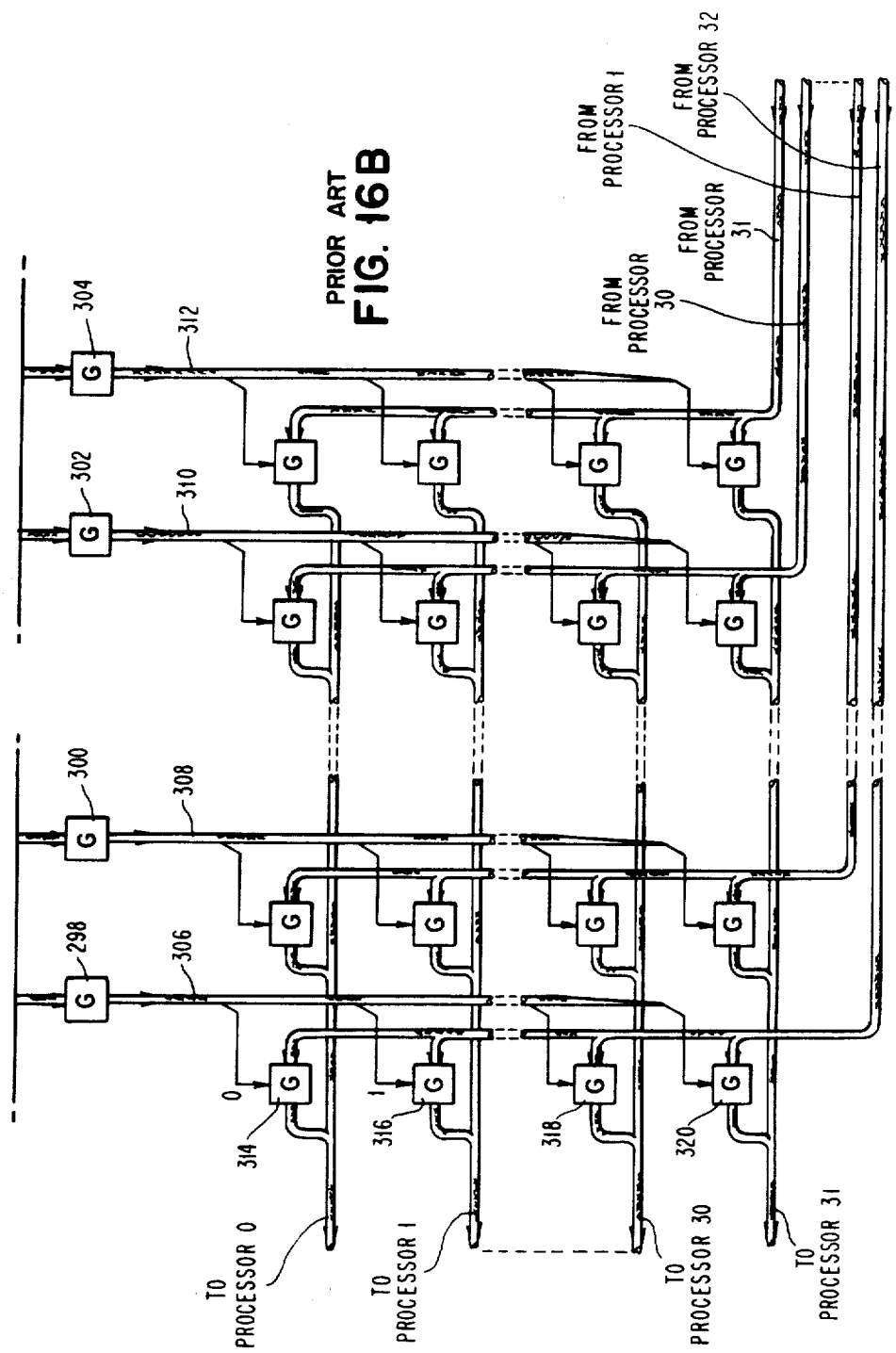
Figures 17, 17A, 17B:
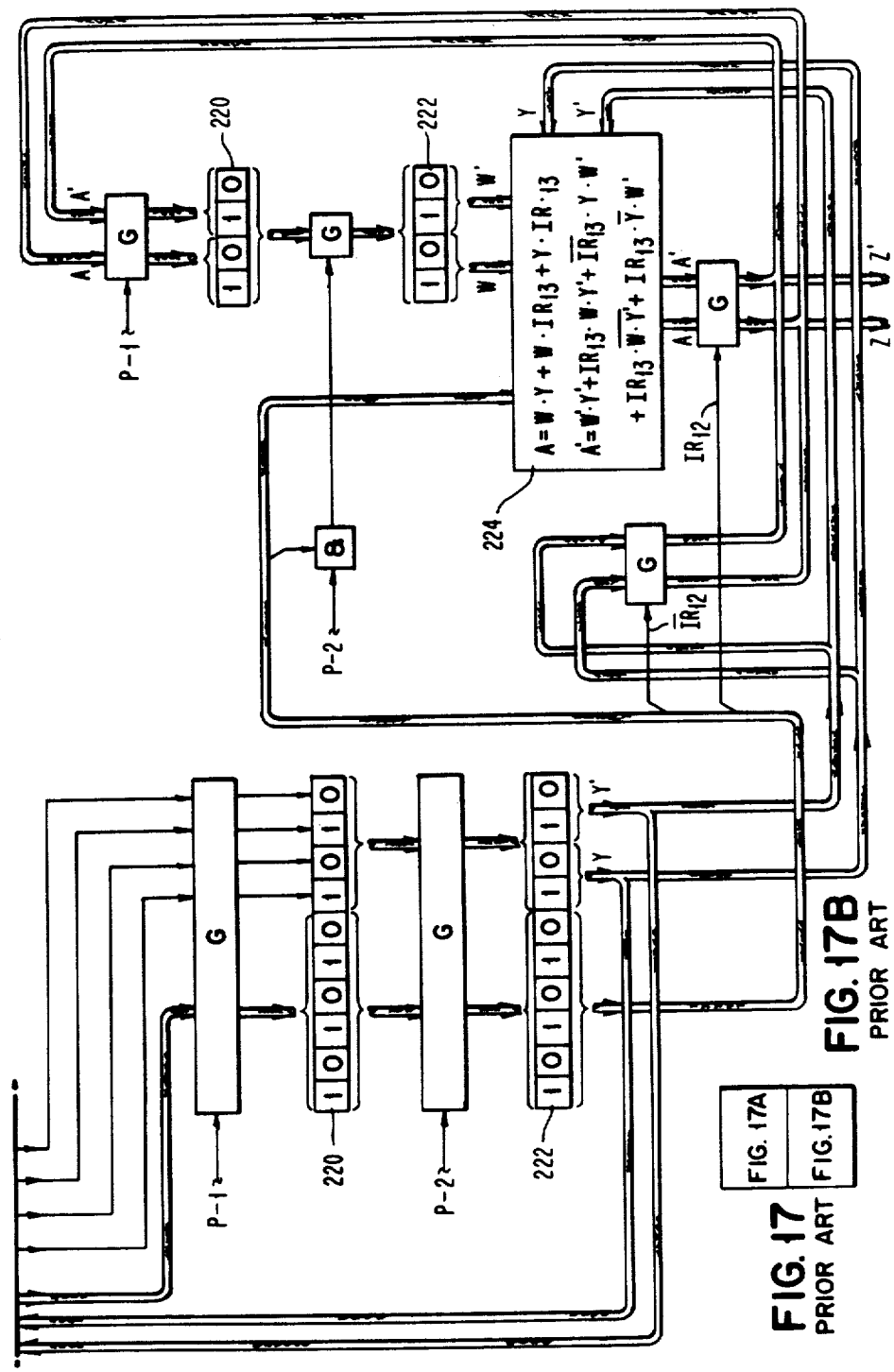
FIGS. 17A and 17B arranged as shown in FIG. 17 illustrate the operation of the logic unit of the processors of the logic simulation machine.
Figure 17A:
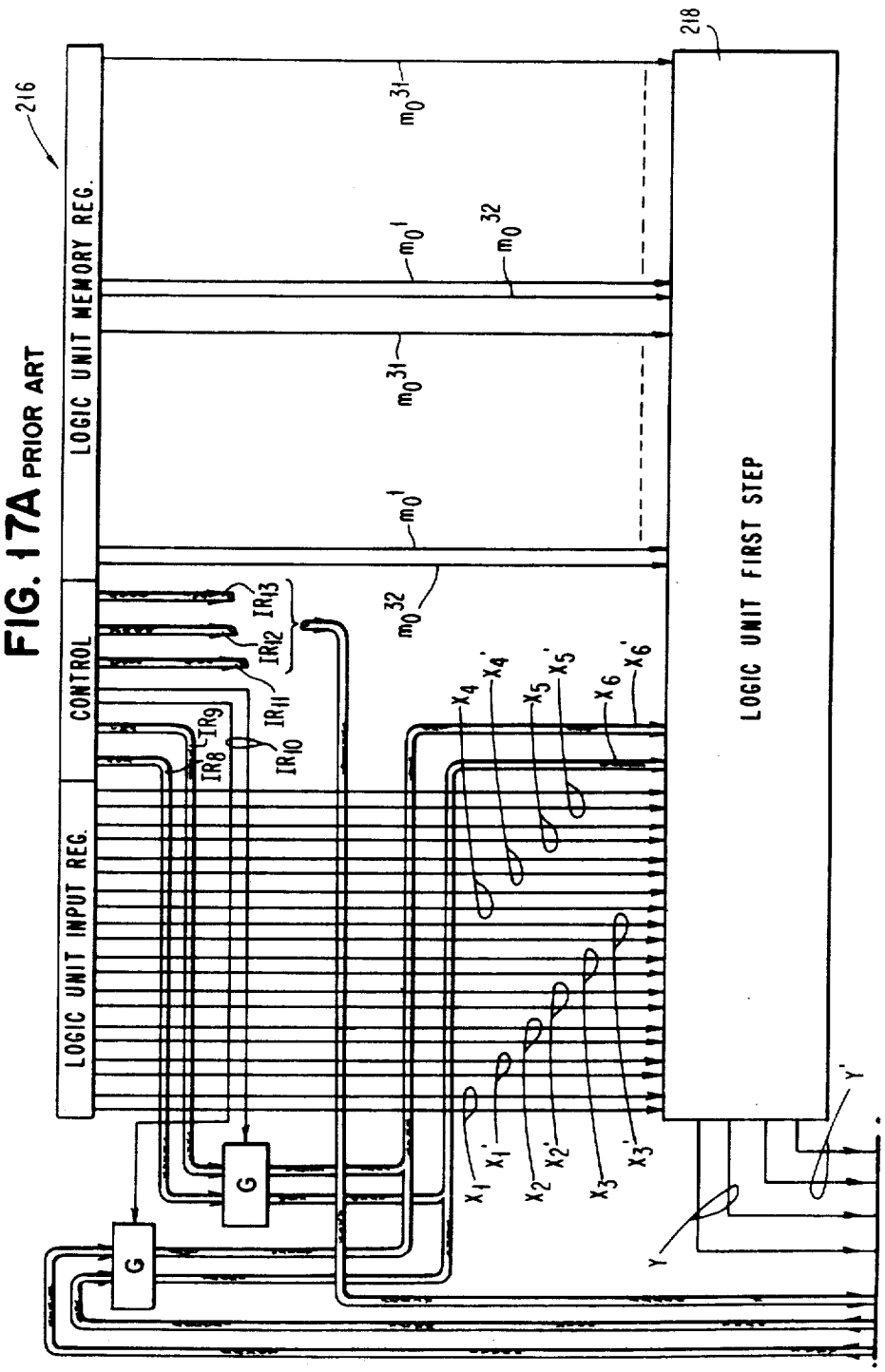
Figure 18:
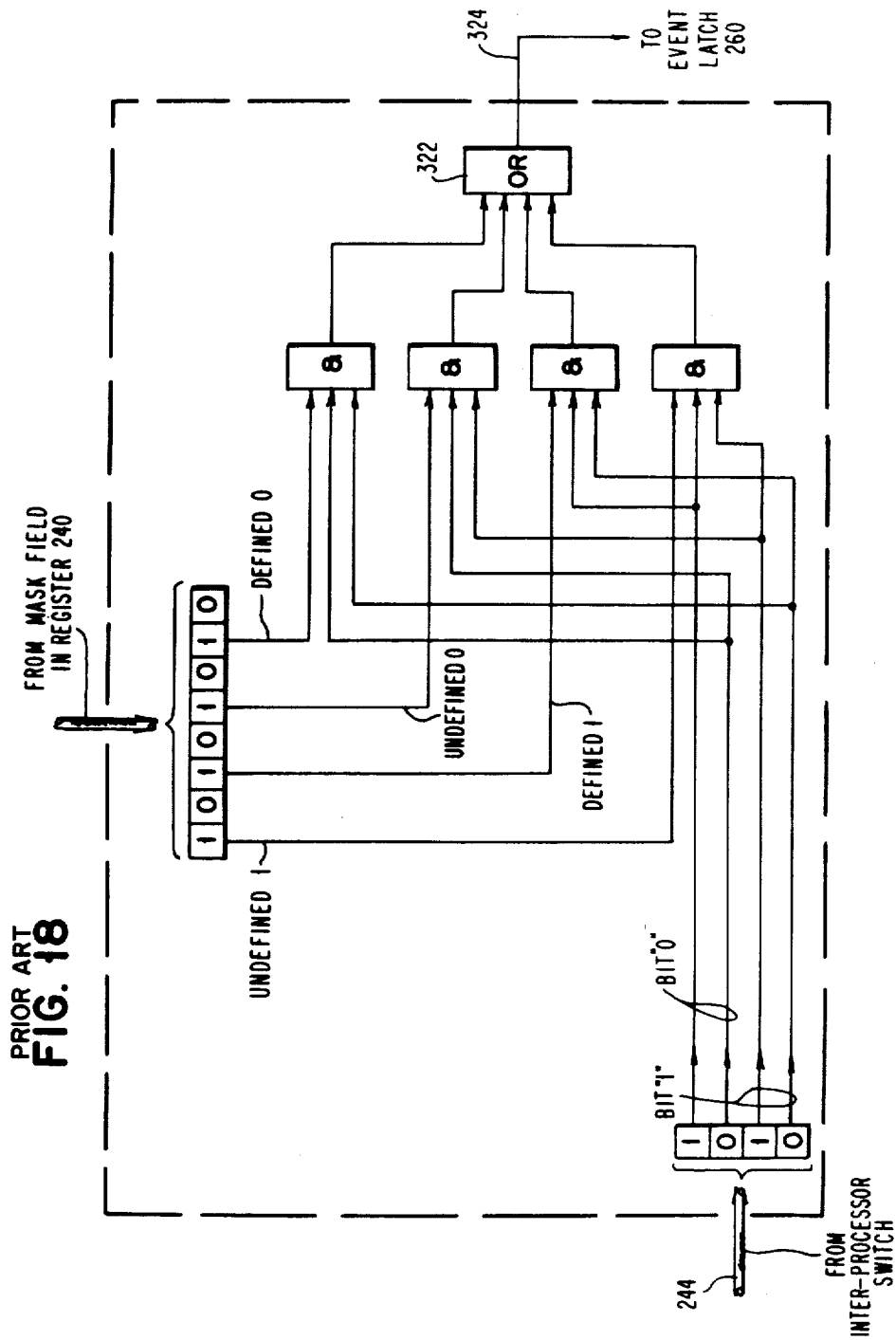
FIG. 18 illustrates a more detailed schematic drawing of the event logic structure of FIG. 13C.

One input to the NAND gate 413 is a signal PRZ. The circuit for generating PRZ is shown in FIG. 24C. Address signals SECTION 1 through SECTION 32 shown in FIG. 16A are fed to inputs of a corresponding one of the OR gates 460-1 through 460-32 of FIG. 24C. (SECTION N=00000 indicates that processor N is addressing the control processor.) The outputs of the OR gates 460-1 through 460-32 are coupled to inputs of a NAND gate 461, the output of which is the signal PRZ. With this circuit, PRZ will be in the 1 state only when all of the bits of any one of SECTION 1 through SECTION 32 are all zeros and will be in the zero state otherwise. That is, PRZ is in the 1 state when at least one of the processors is accessing primary input data (data from the control processor).

The output data from the backup data memory 412 is fed to the "0" input port of a multiplexer 416, the "1" input port of which is coupled to the output of a latch 423-3. The output of the multiplexer 414 is connected to data inputs of data memory A 415 and data memory B 416, those memories being addressed and functioning basically in the same manner as the A and B memories of the basic processors, that is, reading and storing operations are alternated between memories between work cycles. However, in the control processor, it is only necessary to store a single data bit D(n) and a current work space value WS(n). The data bit D(n), upon being read from one of the memories 415 and 416, is passed from a register 417 through a series of latches 419-1 through 419-5 (provided for purposes of synchronization), and then to one input of the multiplexer 433 which is provided in the inter-processor switch.

The work space value WS(n) from the register 417 is applied to one input port of an adder 418, the other input port of which receives the global work space value GWS(n). The circuitry for determining WS(n) for the control processor is the same as in the basic processors, and hence will not be discussed in further detail here except, for later reference, it is noted that the n and n+1 minimum latches are here designated by reference numerals 431-1 and 431-2.

PRZ is used as the carry-in $C_{IN}$ of the adder 418. This is used to perform a two's-complement subtraction in the same manner discussed above in the basic processors. That is, when PRZ=1 indicates that one of the processors is reading primary input data from the control processor, a subtraction is performed between the current work space value WS(n) and the global minimum work space value GWS(n), while when PRZ=0, the work space value supplied from one of the data memories 415 and 416 is passed unaltered through the adder 418.

The output of the adder, resynchronized through the latches 423-1 through 423-5 is fed back to the "0" input port of the multiplexer 414. Also, the same as in the basic processors, the resynchronized output from the adder 418 WS(n+1) is fed to a NOR gate 424 which detects when the work space value WS(n+1) for the next work cycle is all zeros. This fact is indicated by a 0 on the output of the NOR gate 424.

In operation, when the value WS(n+1) is all zeros (indicated by a 1 on the output of the NOR gate 424) and when PRZ=1, the output of the backup data memory is passed through the multiplexer 414; otherwise, WS(n+1) is passed through the multiplexer 414. The former case, similar to the case in the basic processors where one of the delay time values LH and HL is passed through the adder 361 at the start of the simulation of a non-unitary delay, corresponds to a work cycle where primary input data is first provided to one of the processors. The latter case, where no new primary inputs are supplied, corresponds to advancing in time sequence through the logic operations being simulated.

FIG. 24D shows the modification made by the invention to the "IN ADDRESS" portion of the control processor of FIG. 13C. In this modification, the output of the mask portion of the register 238 is ANDed at an AND gate 441 with the P-2 pulse signal. The output from the gate 441 clocks an address counter 440, the output of which addresses the A IN memory.

Referring now to the timing diagram of FIG. 20 and the tables of FIGS. 25A and 25B, an actual example of a logic circuit simulation performed by the improved logic simulation machine of the invention will now be discussed.

Figure 20:
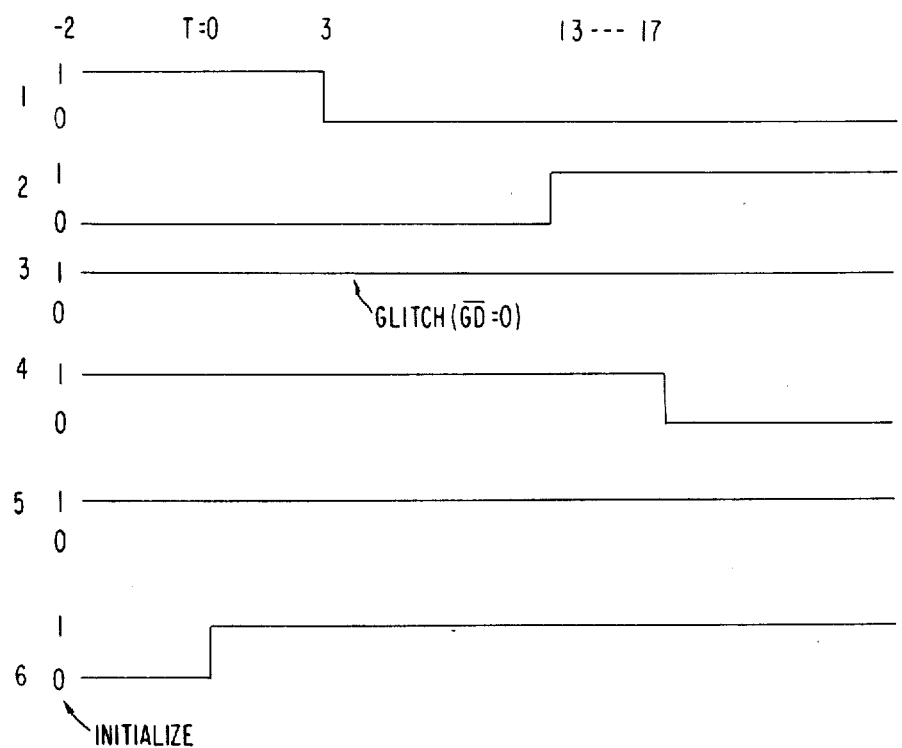
FIG. 20 is a timing diagram used to illustrate the operation of the improved logic simulation machine of the invention.

FIG. 20 shows the signals in the circuit of FIG. 2 where the signal 5 (first primary input) is continuously in the 1 state (for 30 time units, as discussed below) and the signal 6 (second primary input) makes a transition from the 0 to the 1 state at time $t=0$ after having been in the 0 state for a sufficiently long time for the circuit of FIG. 2 to be in its steady state. The tables of FIGS. 25A and 25B describe the states of various signals and values in the basic processor (single basic processor assumed here) and the control processor as time progresses from $t=-2$ (initialization) through $t=0$ (start of simulation) and continuing until the system reaches steady state.

In an initialization state shown at Work Cycle 1 ($t=-2$), $O_D(n)$, $S_D(n)$ and WS(n) are undefined for each of the first four Minor Cycles 1 through 4 (corresponding, respectively, to simulated output signals 1 through 4). In the fifth minor cycle, as a primary input, WS(n) is set to 30 (i.e. signal 5 is assumed to be high for 30 time units—long enough for steady state to be reached). In the sixth minor cycle, WS(n)=2, which is again supplied as a primary input. This corresponds to the two time units from $t=-2$ to $t=0$ where signal 6 makes its transition to the 1 state. Also in Work Cycle 1, the new work space values for the fifth and sixth minor cycles are calculated as WS(n+1)=30−1=29 and WS(n+1)=2−1=1, respectively. (The initial global work space value is preset to 1 for purposes of this subtraction). The DR counter 374 is preset to 1 and the n and n+1 minimum latches 376-1 and 376-2, respectively, remain at their preset values of all 1's (indicated in the tables by "A1") for Minor Cycles 1 through 4, while the minimum latch 431-1 stores the value 29 for Minor Cycle 5 and then retains the value 1 at Minor Cycle 6. (It should be noted that Minor Cycles 5 and 6 are performed by the control processor since they relate to primary inputs. Thus, WS(n), etc. for Minor Cycles 5 and 6 relate not to the basic processor but to the control processor.) As $S_S(n)=0$ for Minor Cycles 1 through 4, LU IN=LU OUT.

In Work Cycle 2 corresponding to $t=0$, the $O_D(n+1)$, $S_D(n+1)$, $S_S(n+1)$ and WS(n+1) values from Work Cycle 1 become $O_D(n)$, $S_D(n+1)$, $S_S(n+1)$ and WS(n), respectively, for this work cycle. The content of 1 remaining from Work Cycle 6 in minimum latch 431-1 is employed as the global minimum work space value, and hence becomes the content of the DR counter for Work Cycle 2. During Work Cycle 2, WS(n+1) becomes equal to the various delay times for the various functions being simulated. For instance, logic function 1 (simulated in Minor Cycle 1) is the NANDing of input signals 5 and 6. The simulated output for the function is predicted to make a transition from high to low. Hence the HL value 2 (the actual delay of 3 minus 1 for the built-in delay of the earlier part of the basic processor) is read from one of the data memories, through the adder 361, and back into the other of the data memories. Since $S_S(n)=0$ for Minor Cycles 1 through 4, no subtraction from HL takes place. In Minor Cycles 5 and 6, the control processor subtracts 1 from the previous work space values of 29 and 1. (Note that the carry-in bit $C_{IN}$ to the adder 418, which is the signal PRZ, will be 1 because the basic processor is accessing primary input information from the control processor.)

The content of the minimum latch 431-1 then becomes 0. The non-zero circuits in both the control and basic processors force that value of 0 (which would otherwise be employed as the global minimum work space value) to 1 for use as the global minimum work space value for the next work cycle.

For Work Cycle 3 corresponding to time $t=1$, the HL and LH values for WS(n+1) from Work Cycle 2 become the new WS(n) values. Because at this point $S_S(n)$ is still 0, these are not decremented. However, in the control processor, the WS(n) value of 28 is decremented by 1 to 27 and a new value of 30, corresponding to the signal 6 being in the 1 state for a period longer than what is required to reach steady state, is read. In Work Cycle 3, the n+1 minimum latch 376-2 in the basic processor retains the value 2 from Minor Cycle 1 throughout the entire work cycle.

Next, in Work Cycle 4 corresponding to $t=3$, values of $S_S(n)=1$ are calculated in Minor Cycles 1 and 3 causing a subtraction of the then present global minimum work space value of 2 from WS(n) in the minor cycles. In Minor Cycle 1, WS(n+1)=0 making 0 the minimum work space for the basic processor for that major cycle and hence making a forced 1 the next global minimum work space value.

The control processor continues to decrement its WS values. However, since the control processor does not affect the operation of the basic processor in later work cycles, Minor Cycles 5 and 6 have been omitted from the tables for later work cycles.

In Work Cycle 5, a glitch is detected at Minor Cycle 3 because LU IN=$S_S(n)=1$. The detection of the glitch forces $S_S(n+1)$ to be 0 when it would otherwise be 1. Thus, during the next work cycle, $S_S(n)=0$ and hence there is no subtraction performed on the work space value, while instead the appropriate delay time value is read back through the multiplexer 352 and adder 361 to become the value WS(n+1) for Minor Cycle 3 in Work Cycle 6. The value of LU IN is of course then propagated as LU OUT for Minor Cycle 3 of Work Cycle 5.

The above-described process continues through Work Cycle 9 where steady state is reached at t=17 and all of the correct simulated logic function outputs have been correctly determined.

The outputs from the logic simulation machine to the host computer are LU OUT, and if desired $\overline{GD}$ and $S_S(n+1)$, from each basic processor. These may be communicated to the host processor using a time multiplexed technique or any other suitable means. Also, it may in some instances be desired to communicate the output values from the DR counter(s) to the host. This may be done with an arrangement such as that shown in FIG. 24B. In that figure, an address counter 450, reset to zero by an INITIALIZATION signal from the host computer, is incremented by DR LOAD pulses. The DR LOAD pulses, delayed through a delay circuit 451, also clock a DR stack memory 452. The host computer can read out the stack memory 452 to obtain the DR counter contents for each major cycle during simulation.

Figure 13D:
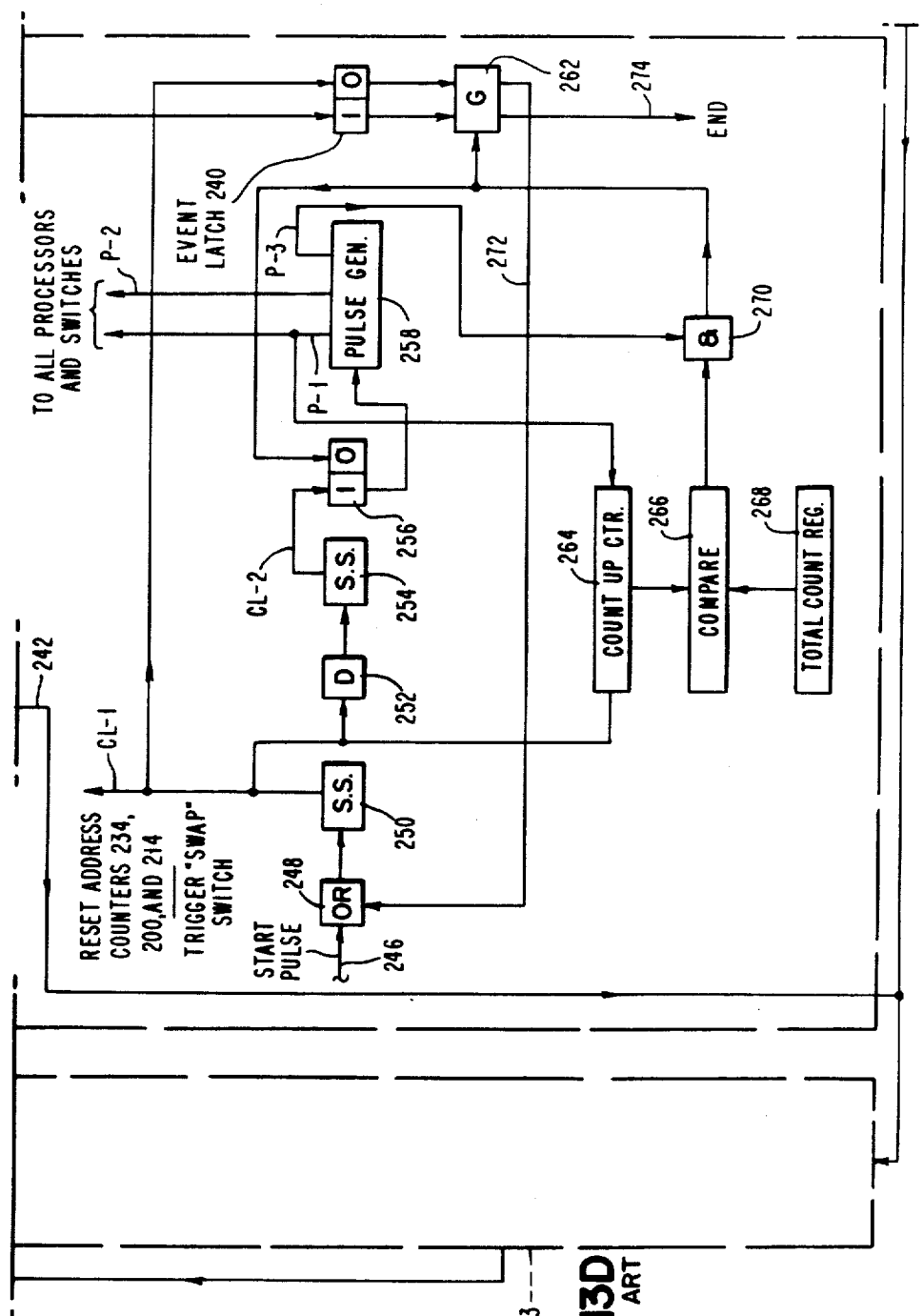
Figure 14B:
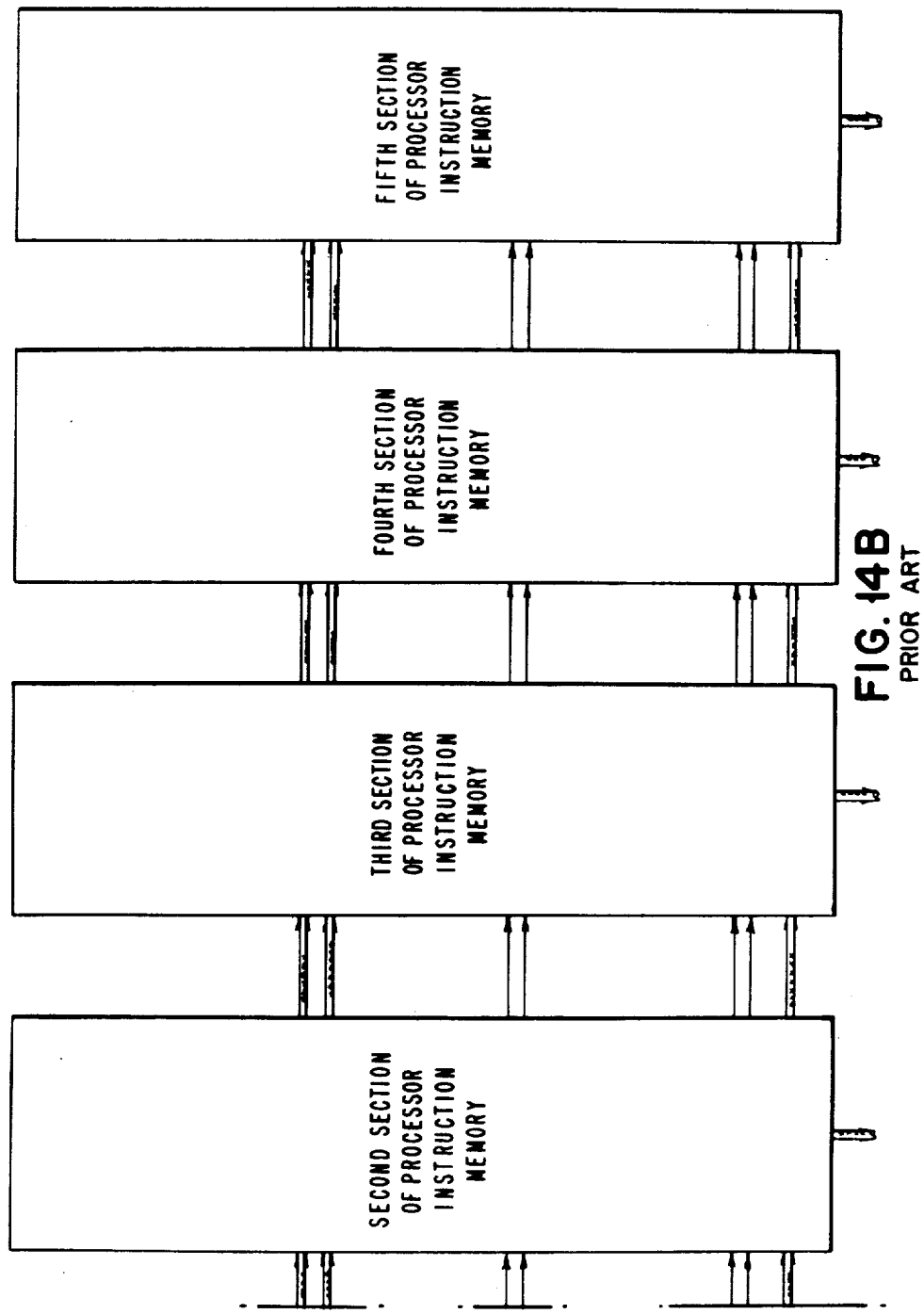
Figure 15:
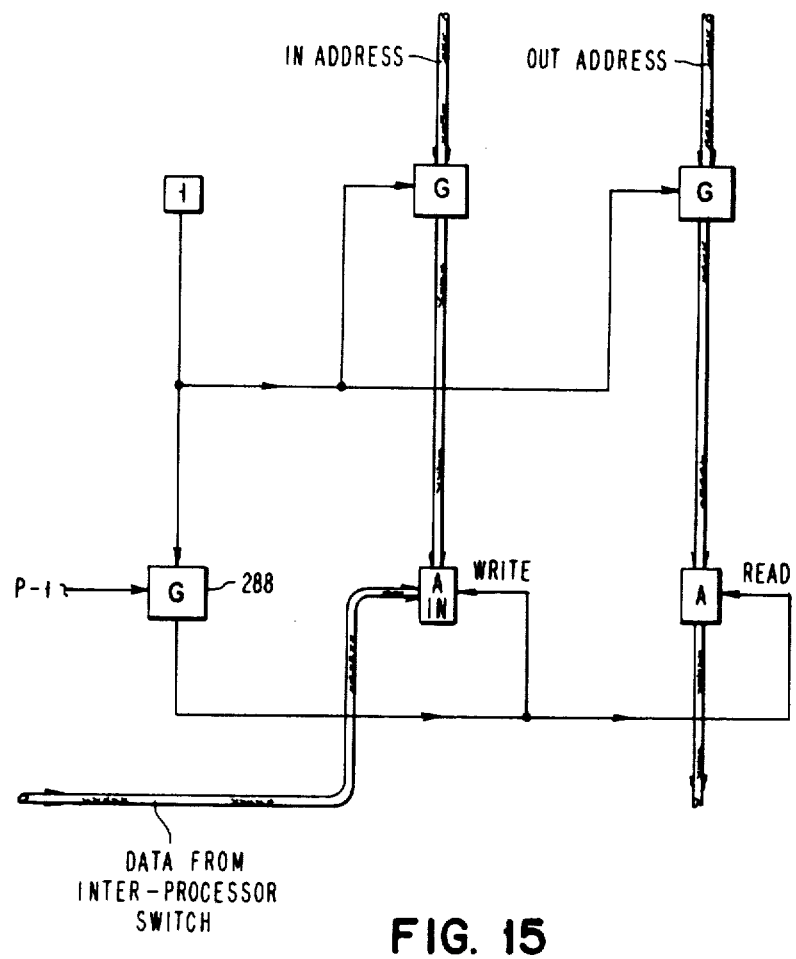
FIG. 15 is an illustration of a more detailed schematic diagram of the memories used in the control processor of the logic simulation machine.

Further in accordance with the invention, a slight modification is made to the portion of the control processor circuitry shown in FIG. 13D to cause the timing signals CL-1, CL-2, P-1, P-2, etc. to occur at the now appropriate times. Specifically, due to the modifications made by the invention, it is necessary to delay the start of these signals due to the insertion of the Phase II time period described above. This is done quite simply by inserting and AND gate in series with line 246 leading to the OR gate 248 and connecting the DR LOAD signal to a second input of the AND gate.

This completes the description of the preferred embodiments of the invention. Although preferred embodiments have been described, it is believed that numerous modifications and alterations thereto would occur to one of ordinary skill in without departing from the spirit and scope of the invention.

We claim:

1. A method for simulating logic operations comprising the steps of:
   simulating one or more time sequential logic functions in each of a plurality of basic processors operating in time unison, and determining a value of a simulated logic function output in each of said plurality of basic processors as a proposed output with a fixed constant delay for the logic function being simulated; and
   delaying said proposed output from a final output for a delay time specific to said logic function being simulated.

2. The method of claim 1, wherein said delay time is further specific to whether said proposed output has changed from a high to a low logic level or from a low to a high logic level.

3. The method of either of claims 1 or 2, further comprising the steps of:
   detecting the presence of a glitch in said proposed output of a duration less than the corresponding delay time of said logic function being simulated; and
   inhibiting said glitch from said final output.

4. A method for simulating logic operations comprising the steps of:
   simulating one or more time sequential logic functions in each of a plurality of basic processors, said logic functions in each of said basic processors being simulated in successive work cycles of logic operations;
   determining, in each of said basic processors in each of said work cycles, a minimum work space value as a minimum time to a next successive logic operation among all logic functions simulated by said basic processor for each said work cycle;
   determining a global minimum work space value among all said basic processors for each said work cycle as a minimum one of work space values among all of said basic processors; and
   advancing each of said basic processors in time sequence in each of said work cycles by said global minimum work space value.

5. The method of claim 4, wherein said step of determining a minimum time to a next successive logic operation comprises:
   calculating a time to a predicted simulated logic function output transition time in accordance with a stored delay time for each logic function to be simulated during each said work cycle; and
   storing a minimum calculated time to a predicted simulated function output transition time among all of said logic functions simulated during each said work cycle.

6. The method of claim 5, wherein said step of calculating a time to a predicted simulated logic function output transition time comprises:
   for an initial work cycle and for a first work cycle following a transition in said simulated function output for the function simulated, subtracting said global minimum work space value from said stored delay time for each said simulated logic function and storing the difference; and
   repetitively for successive work cycles, for each said simulated logic function, and until a predicted transition occurs in said simulated logic function output, subtracting said minimum work space value from said difference and replacing said difference with a new difference thus calculated.

7. The method of claim 5, wherein said delay time is one of a first delay time value corresponding to low-to-high transitions and a second delay time value corresponding to high-to-low transitions of said simulated logic function output for each said simulated logic function.

8. The method of claim 7, further comprising the step of:
   selecting one of said first and second delay time values in accordance with a state of a simulated logic function output in a present work cycle and in a work cycle immediately prior to a present work cycle where a transition of a simulated logic function output occurs.

9. The method of any one of claims 4–8 further comprising the steps of:
   detecting presence of a glitch having a duration less than a corresponding delay time of a logic function being simulated; and
   inhibiting said glitch in a simulated logic function output.

10. A method for simulating logic operations in successive work cycles in a plurality of basic processors, comprising the steps of:
   I. in each of a plurality of basic processors and for each logic function simulated in each of said basic processors:
      (a) determining a value LU IN of a simulated logic function output with a fixed constant minimum delay time;

(b) reading an old data value $O_D(n)$, a saved data value $S_D(n)$, a status bit value $S_S(n)$ and a work space value $WS(n)$ from a first signal value memory;

(c) reading at least one of a low-to-high delay time value LH and a high-to-low delay time value HL from an instruction memory;

(d) selecting one of said value $WS(n)$, LH and HL in accordance with said values $S_D(n)$ and $S_S(n)$;

(e) if said value $WS(n)$ is selected in step (d), subtracting a global minimum work space value $GWS(n)$ therefrom and storing the difference value this calculated as a value $WS(n+1)$, and if one of said values LH and HL is selected in step (d), storing the selected value as said value $WS(n+1)$;

(f) performing a logic OR of individual bits of said value $WS(n+1)$ to produce a signal WSO;

(g) performing logic operations:

$$SO = S_S(n) + [(LU\ IN) + S_D(n)],$$

$$\overline{GD} = \overline{S_S(n)} \cdot [(LU\ IN) + S_D(n)],$$

and $$S_S(n+1) = WSO + SO + GD.$$

(h) selecting one of LU IN and $O_D(n)$ as a final simulated logic function output in accordance with a state of $S_S(n+1)$;

(i) storing said $WS(n+1)$, $S_S(n+1)$, $S_D(n+1) = LU$ IN and $O_D(n+1)$ in a second signal value memory for a next successive work cycle;

(j) repeating said steps (a) through (i) for each simulated logic function for each said work cycle alternating reading and storing in said first and second signal value memories;

II. for each said work cycle for each said basic processor, determining a minimum value of $WS(n+1)$; and III. for each said work cycle determining a global minimum work space value $GWS(n+1)$ for a next successive work cycle as a minimum value of $WS(n+1)$ among all of said basic processors.

11. The method of claim 10, wherein said step II comprises, in each of said basic processors:
initializing a register with a maximum value;
comparing each value of $WS(n+1)$ for each logic function simulated with the content of said register; and
if said value of $WS(n+1)$ is less than said content of said register, replacing said content of said register with $WS(n+1)$, and otherwise retaining said content of said register.

12. The method of claim 11, wherein said step III comprises:
initializing a counter to a minimum count value;
incrementing said counter;
while incrementing said counter, comparing a count value of said counter with values remaining in each of said registers of each of said basic processors; and
when said count value first becomes equal to one of said values remaining in said registers, employing said count value than present as said global minimum work space value $GWS(n+1)$.

13. A logic function simulator comprising a plurality of basic processors, a control processor, and an interprocessor switch interconnecting said basic processors and said control processor, each of said basic processors comprising:
means for storing delay times for each logic function simulated by that basic processor;
means operating in response to said storing means for determining a time to a next successive logic operation for each said simulated logic function in accordance with a corresponding delay time;
means operating in response to said time determining means for determining a minimum work space value as a minimum time to a next successive logic operation among all said simulated logic functions; and
means for advancing said basic processor in time sequence by a global minimum work space value, said global minimum work space value being a minimum one of minimum work space values among all said basic processors.

14. The logic function simulator of claim 13, wherein said means for determining a time to a next successive logic operation for each said simulated logic function comprises means for subtracting said global minimum work space value from a delay time for each said simulated logic function.

15. The logic functions simulator of claim 14, wherein said subtracting means subtracts said global minimum work space value from said delay time for said simulated logic function for an initial cycle related to a predetermined logic operation and thereafter for successive cycles subtracts said global minimum work space value from a difference thus calculated and replaces said difference with a new difference determined by subtracting said global minimum work space value from the previous difference.

16. The logic function simulator of claim 15, further comprising means for calculating a new value of said global minimum work space value for each said cycle.

17. The logic function simulator of any one of claims 13–16 further comprising:
means for detecting the presence of a glitch in a simulated output for each said simulated logic function of a duration less than the corresponding delay time of said simulated logic function; and
means for inhibiting said glitch.

18. A logic function simulator comprising a plurality of basic processors, a control processor, and an interprocessor switch interconnecting said basic processors and said control processor, said basic processors and said control processor comprising means for simultaneously advancing said basic processors and said control processor through logic operations to be simulated in each work cycle, at a time interval equivalent to a minimum time to a next successive logic operation, among all said basic processors, said minimum time being determined in each said work cycle.

19. The logic function simulator of claim 18, wherein said advancing means comprises means in each of said basic processors for storing delay times for each logic function being simulated, said delay times including delay times for each of a low-to-high and high-to-low transition of each simulated output of each simulated logic function; means for selecting one of said delay times corresponding to a low-to-high transition or a high-to-low transition in accordance with a type of transition predicted for each said simulated logic function; and means for accumulatively subtracting a global minimum work space value from the selected delay time for each said simulated logic function, said global minimum work space value being a minimum work space value among all of said basic processors.

20. The logic function simulator of either one of claims 18 or 19 further comprising:

means for detecting the presence of a glitch in each simulated output of each said simulated logic function having a duration less than a corresponding delay time for a corresponding simulated logic function; and means for inhibiting said glitch.

21. A logic function simulator comprising:

I. a plurality of basic processors, each of said processors comprising:

(a) means for determining a value of a simulated logic function output as a proposed output LU IN with a fixed constant delay for the logic function being simulated;

(b) first and second signal value memories;

(c) means for storing data received from said first and second signal value memories, said data received from said signal value memories including an old data value $O_D(n)$, a saved data value $S_D(n)$, a status bit value $S_S(n)$ and a work space value $WS(n)$;

(d) an instruction memory for storing a low-to-high delay time value LH and a high-to-low delay time value HL for each logic function simulated by the basic processor;

(e) multiplexer means for selecting one of $WS(n)$, LH and HL in accordance with $S_S(n)$ and $S_D(n)$;

(f) subtractor means for subtracting a minimum work space value from $WS(n)$ to obtain a value $WS(n+1)$ if said $WS(n)$ is selected and passing the selected of said LH and HL if one of said LH and HL is selected;

(g) logic circuit means operating in response to an output of said subtracting means, said signals LU IN, $O_D(n)$, $S_D(n)$ and $S_S(n)$ for determining a next successive value $S_S(n+1)$ of $S_S(n)$ indicative of whether or not a change in said LU IN has occurred but is not yet to be propagated;

(h) means for selecting as an output $O_D(n+1)$ one of LU IN and $O_D(n+1)$ in accordance with an output of said logic circuit means; and (i) switch means for loading into a selected one of said first and second signal value memories said $S_S(n+1)$, LU IN=$S_D(n+1)$, $O_D(n+1)$ and $WS(n+1)$ to become $O_D(n)$, $S_S(n)$ and $WS(n)$, respectively, for a next successive work cycle for a corresponding logic function;

II. a control processor for providing primary signal inputs to said basic processors; and III. an inter-processor switch for interconnecting said basic processor and said control processor.

* * * * *